(12) United States Patent
Gupta et al.

(10) Patent No.: US 11,300,363 B2
(45) Date of Patent: Apr. 12, 2022

(54) HEAT SINK ASSEMBLY FOR ELECTRONIC EQUIPMENT

(71) Applicant: Cisco Technology, Inc., San Jose, CA (US)

(72) Inventors: Rohit Dev Gupta, Bangalore (IN); Tilak Gaitonde, Bangalore (IN); Prashanth Pavithran, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/922,015

(22) Filed: Jul. 7, 2020

(65) Prior Publication Data

US 2022/0011056 A1    Jan. 13, 2022

(51) Int. Cl.
| | |
|---|---|
| *F28D 19/04* | (2006.01) |
| *F28F 3/02* | (2006.01) |
| *F28F 5/02* | (2006.01) |
| *F28D 21/00* | (2006.01) |

(52) U.S. Cl.
CPC ............. *F28D 19/04* (2013.01); *F28F 3/02* (2013.01); *F28F 5/02* (2013.01); *F28D 2021/0029* (2013.01)

(58) Field of Classification Search
CPC .... F28D 19/04; F28D 2021/0029; F28F 3/02; F28F 5/02; H05K 7/20563; G06F 1/183
USPC ......................................................... 165/80.3
See application file for complete search history.

(56) References Cited

U.S. PATENT DOCUMENTS

| | | | |
|---|---|---|---|
| 6,813,155 B2 * | 11/2004 | Lo | H01L 23/4093 |
| | | | 165/80.3 |
| 7,212,409 B1 | 5/2007 | Belady et al. | |
| 7,733,652 B2 | 6/2010 | Costello et al. | |
| 8,427,837 B2 | 4/2013 | Nguyen | |
| 8,854,818 B1 | 10/2014 | Angelucci | |
| 8,911,244 B2 | 12/2014 | Elison et al. | |
| 9,126,405 B2 * | 9/2015 | Sugiura | B41J 2/175 |
| 9,313,925 B2 * | 4/2016 | Kelty | G06F 1/20 |
| 9,453,972 B1 | 9/2016 | Arvelo et al. | |
| 10,212,852 B1 | 2/2019 | Reddy et al. | |

(Continued)

OTHER PUBLICATIONS

International Search Report and Written Opinion in counterpad International Application No. PCT/US2021/039848, dated Oct. 21, 2021, 20 pages.

*Primary Examiner* — Jon T. Schermerhorn, Jr.
(74) *Attorney, Agent, or Firm* — Edell, Shapiro & Finnan, LLC

(57) ABSTRACT

A heat sink assembly for a cage for a field replaceable computing module includes a heat sink, a thermal interface material (TIM), and an actuation assembly. The heat sink includes fins and a mating surface positioned at a base of the fins. The TIM includes a first surface that is coupled to the mating surface of the heat sink and a second surface that is opposite the first surface. Thus, the second surface can engage a heat transfer surface of a field replaceable computing module installed adjacent the heat sink. The actuation assembly includes a rotational cam. When the rotational cam is in a first position, the second surface of the TIM contacts the heat transfer surface of the computing module. When the rotational cam moves to a second position, the second surface of the TIM is moved a distance away from the heat transfer surface of the computing module.

20 Claims, 22 Drawing Sheets

(56) References Cited

U.S. PATENT DOCUMENTS

| | | | |
|---|---|---|---|
| 10,295,767 B2 | 5/2019 | Chen et al. | |
| 2003/0161108 A1* | 8/2003 | Bright | G02B 6/4277 |
| | | | 361/707 |
| 2008/0239677 A1* | 10/2008 | Coleman | H01L 23/4093 |
| | | | 361/719 |
| 2009/0059533 A1* | 3/2009 | Li | H01L 23/467 |
| | | | 361/709 |
| 2009/0284930 A1 | 11/2009 | Ice | |
| 2012/0243168 A1* | 9/2012 | Tanaka | G11B 33/144 |
| | | | 361/679.32 |
| 2014/0010552 A1 | 1/2014 | McColloch et al. | |
| 2014/0170898 A1 | 6/2014 | Elison et al. | |
| 2015/0092354 A1 | 4/2015 | Kelty | |
| 2017/0269314 A1 | 9/2017 | Gaal | |
| 2021/0151361 A1* | 5/2021 | Schlack | H01L 23/4093 |

\* cited by examiner

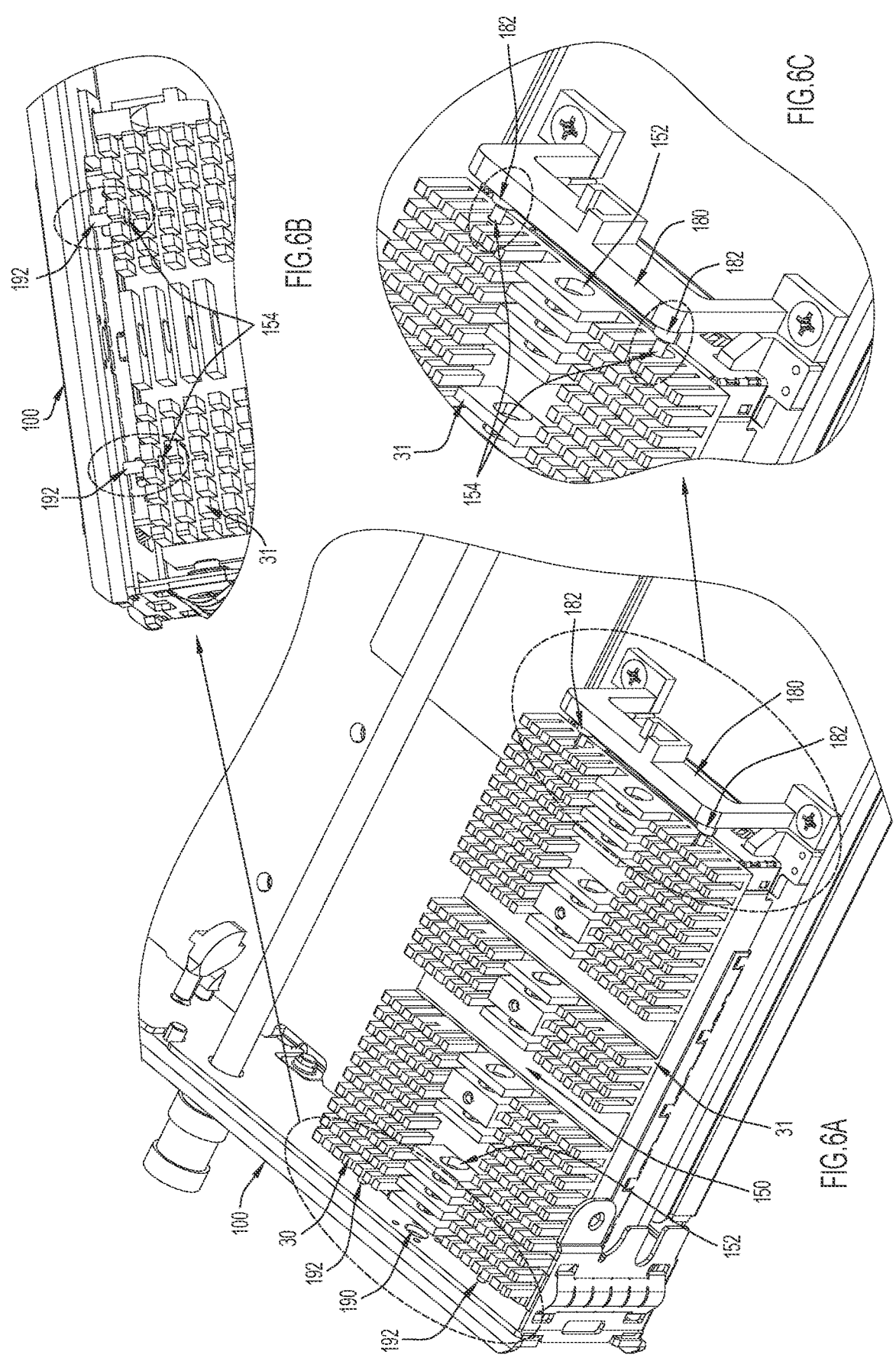

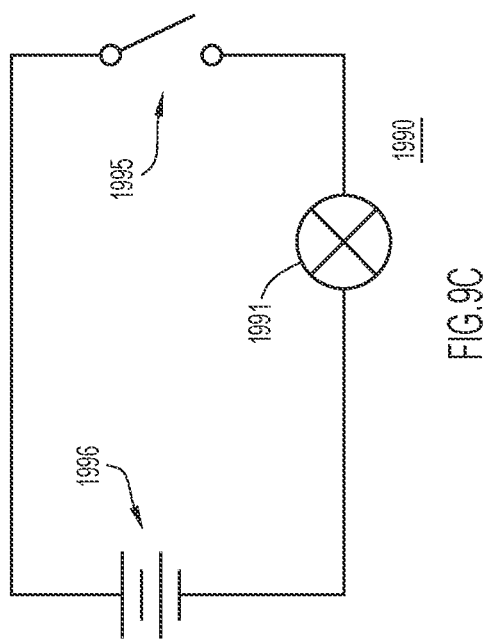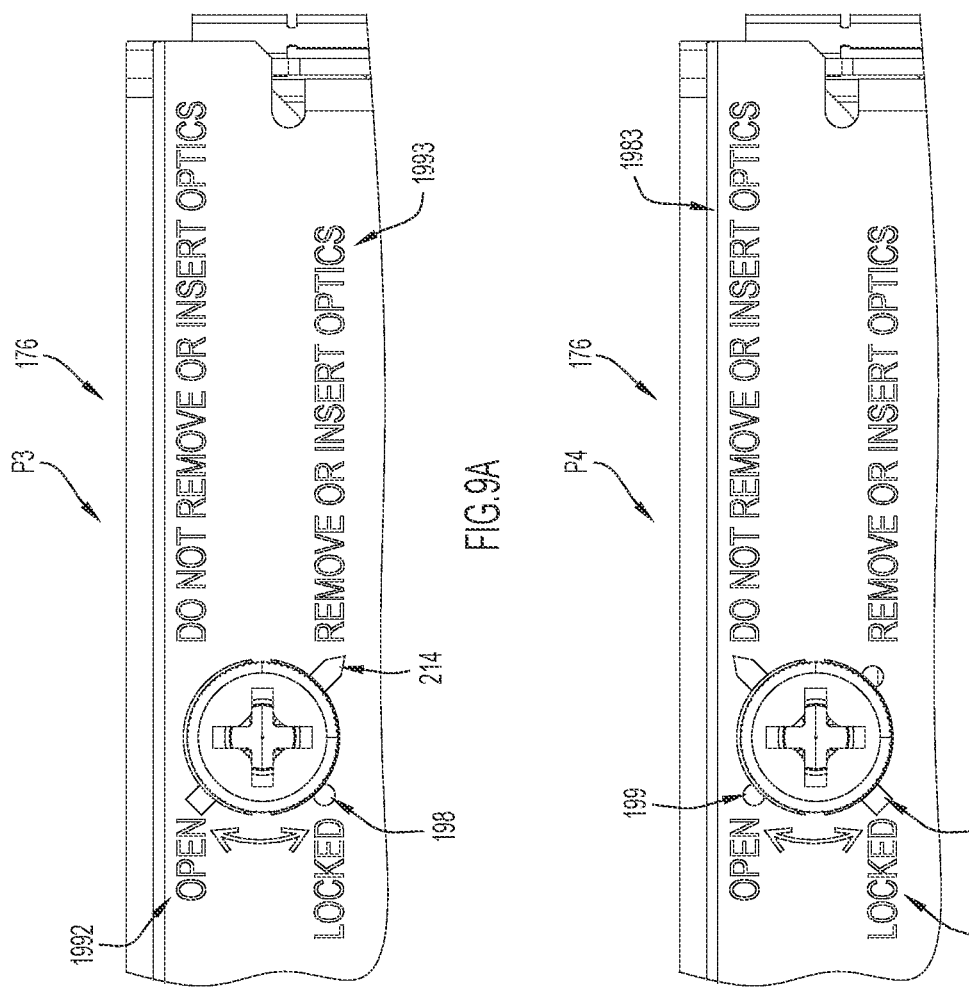

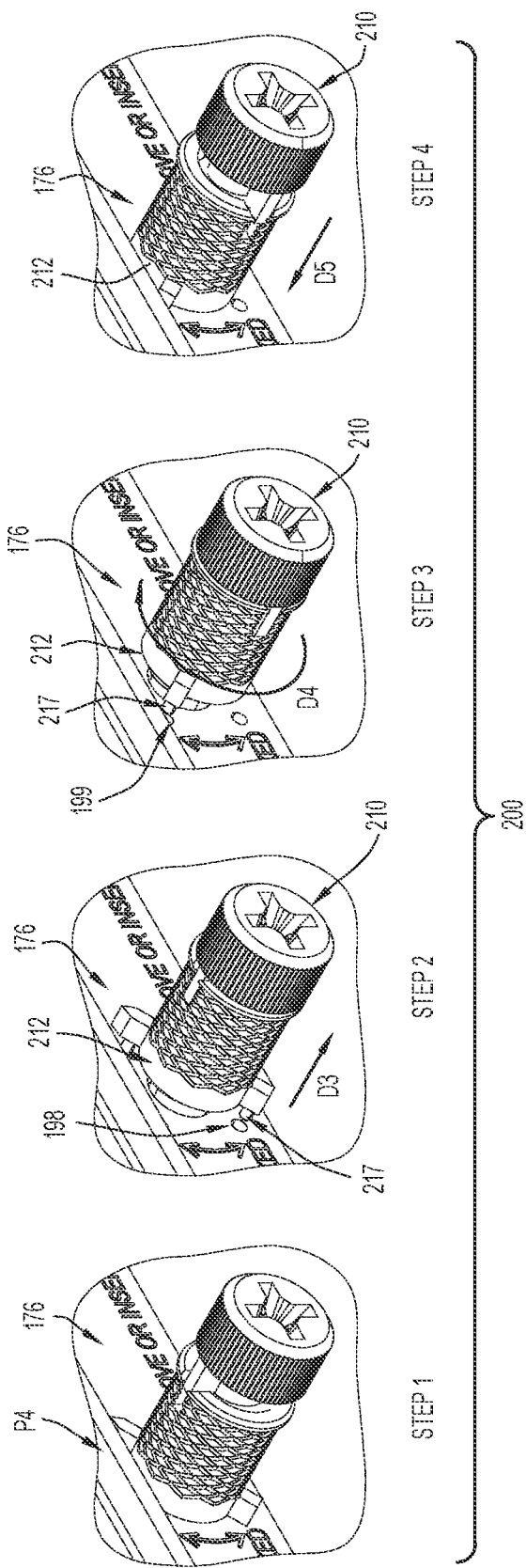

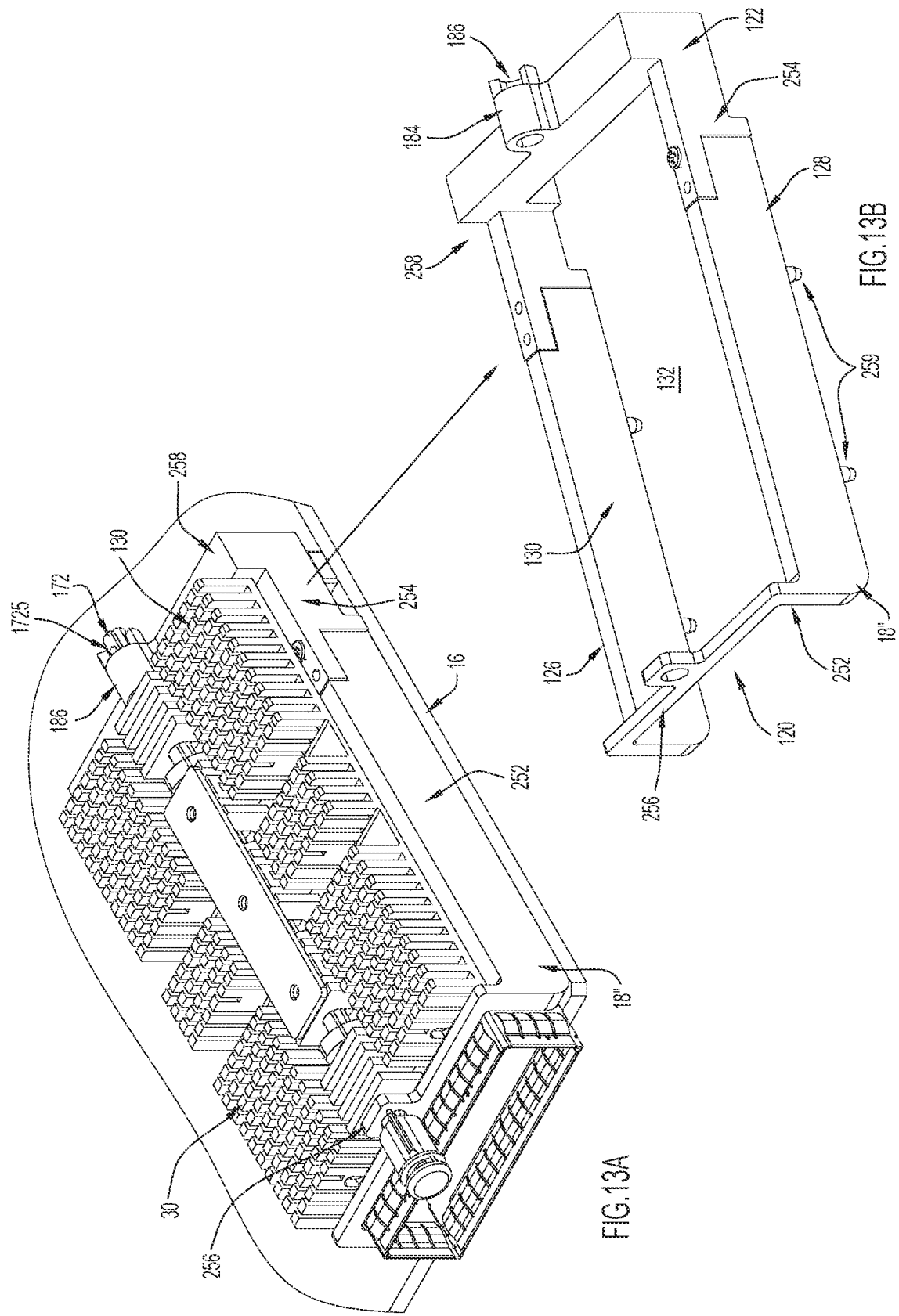

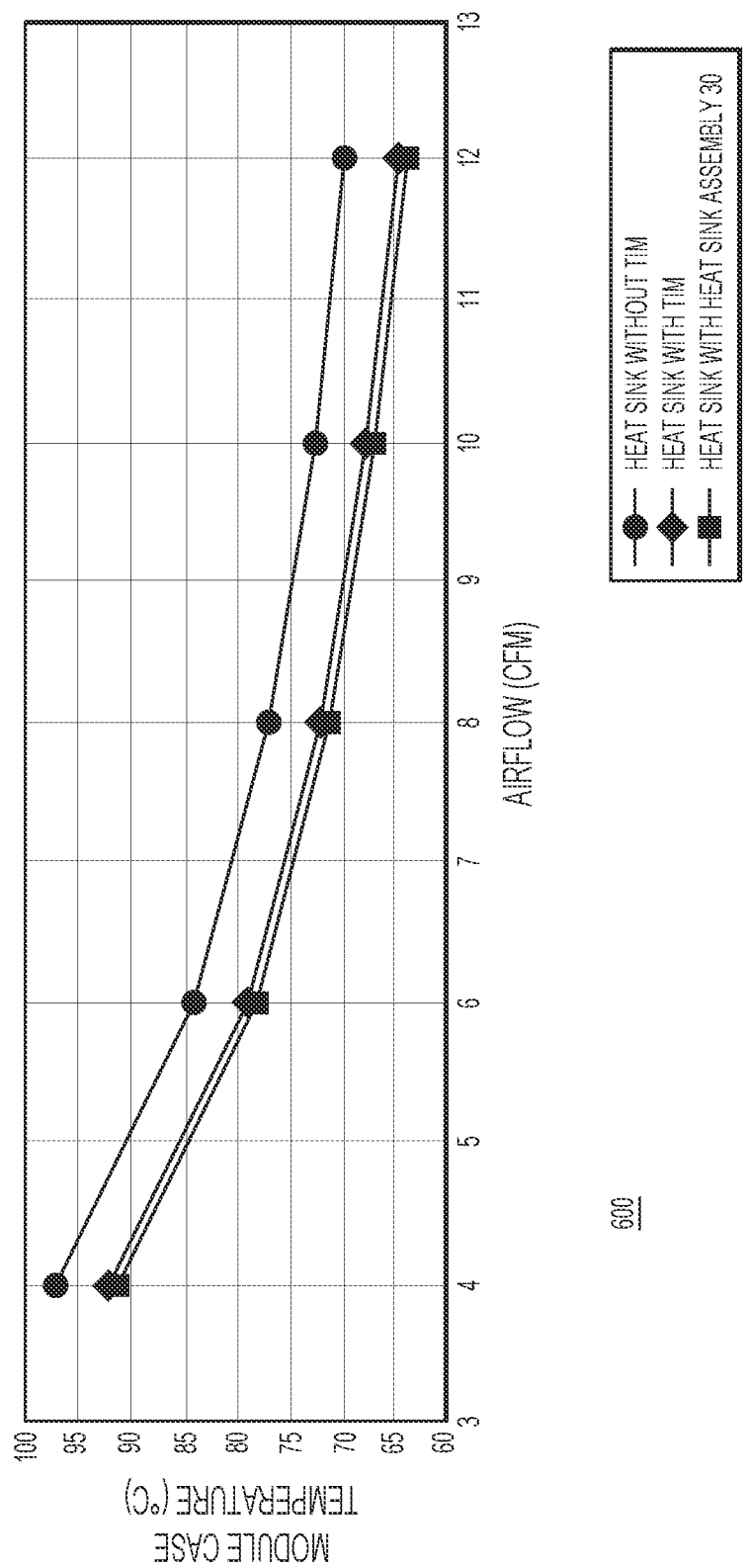

HEAT SINK ASSEMBLY FOR ELECTRONIC EQUIPMENT

TECHNICAL FIELD

The present disclosure relates to high performance and/or high density computing solutions, such as line cards and computing blades, that can receive field replaceable computing modules, and in particular to a heat sink assembly for these computing solutions.

BACKGROUND

Over the past several years, the information technology field has seen a tremendous increase in the performance of electronic equipment coupled with a decrease in geometric floor space to house the equipment. For instance, due at least to recent advances in high throughput computing, field replaceable computing modules, such as optical transceivers, are dissipating more power (e.g., 25 Watts (W) or more) in smaller form factors (i.e., computing modules are being provided with increasingly higher power densities). However, permissible operating temperatures, which may be defined by temperature limits of internal components included in the field replaceable computing modules, have remained relatively stagnant. Thus, more effective cooling solutions for field replaceable computing modules are continuously desired.

BRIEF DESCRIPTION OF THE DRAWINGS

FIG. 6A illustrates a top, rear perspective view of the heat sink assembly of FIG. 3A, with portions of the actuation assembly removed, according to an example embodiment.

FIGS. 6B and 6C illustrate detailed perspective views of a front portion and a back portion of the view shown in FIG. 6A, respectively, according to an example embodiment.

FIGS. 9A and 9B illustrate a front view of an actuator included on the portion of the exterior of FIG. 8, the actuator being disposed in an open position in FIG. 9A and a closed position in FIG. 9B, according to an example embodiment.

FIG. 9C is a schematic diagram illustrating an example embodiment of circuitry included in a heat sink assembly formed in accordance with the present application, according to an example embodiment.

FIG. 11 illustrates steps for operating the actuator of FIGS. 9A and 9B, according to an example embodiment.

FIG. 13A illustrates a front perspective view of yet another example module cage that may be included in the computing solution of FIG. 2, according to an example embodiment.

FIG. 13B illustrates a top perspective view of the module cage of FIG. 13A independent of a heat sink assembly, according to an example embodiment.

FIG. 19 is a diagram illustrating thermal advantages provided by the heat sink assembly presented herein.

Like reference numerals have been used to identify like elements throughout this disclosure.

DESCRIPTION OF EXAMPLE EMBODIMENTS

Overview

Figure 1A:
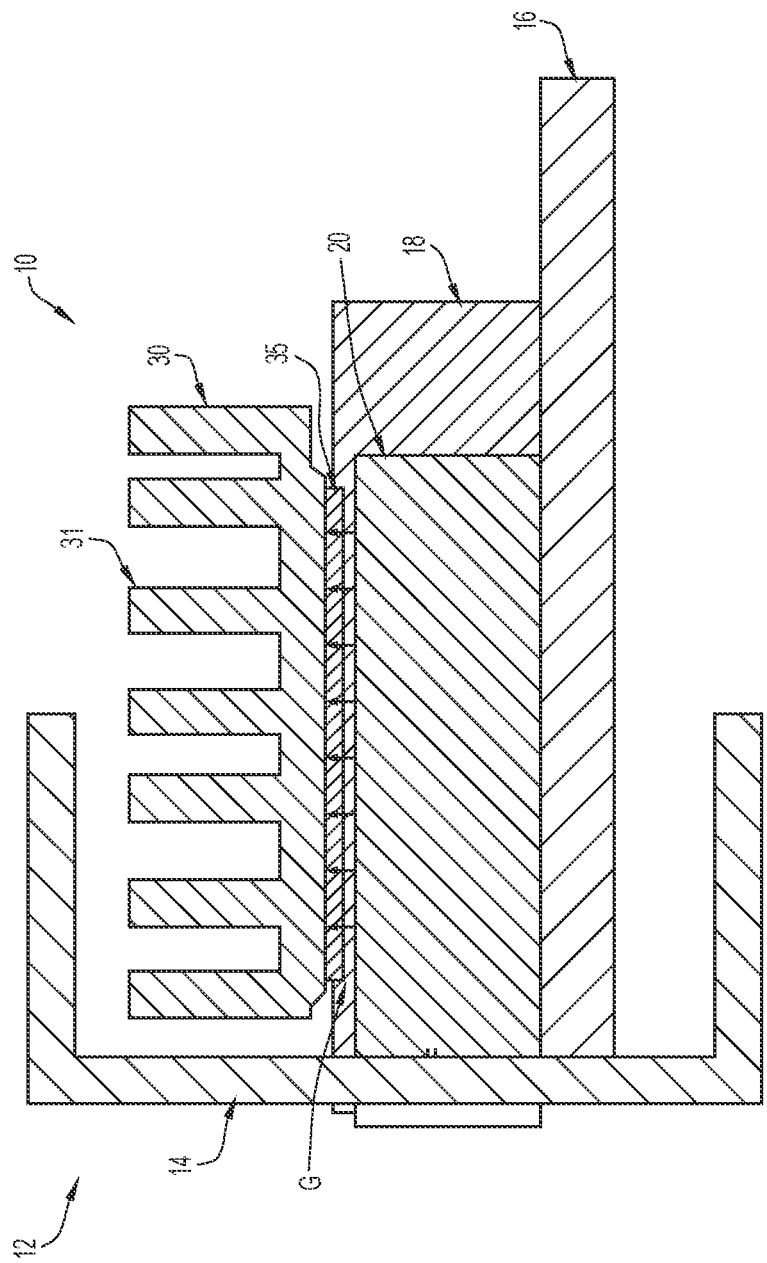
FIG. 1A is a schematic diagram illustrating a sectional view of an example embodiment of a heat sink assembly formed in accordance with the present application.

Briefly, presented herein is a heat sink assembly for a cage for a field replaceable computing module, an apparatus including the cage, and a system including the apparatus and the field replaceable computing module. In one embodiment, a heat sink assembly for a cage for a field replaceable computing module includes a heat sink, a thermal interface material, and an actuation assembly. The heat sink includes fins to facilitate heat dissipation and a mating surface positioned at a base of the fins. The thermal interface material includes a first surface that is coupled to the mating surface of the heat sink and a second surface that is opposite the first surface. Thus, the second surface can engage a heat transfer surface of a field replaceable computing module installed adjacent to the heat sink. The actuation assembly includes a rotational cam. When the rotational cam is in a first position, the second surface of the thermal interface material contacts the heat transfer surface of the field replaceable computing module, and when the rotational cam moves to a second position, the second surface of the thermal interface material is moved a distance away from the heat transfer surface of the field replaceable computing module.

Example Embodiments

The heat sink assembly presented herein enables high performance and/or high density computing solutions, such as line cards and computing blades, to effectively dissipate heat from field replaceable computing modules without inhibiting insertion or removal of the field replaceable computing modules (also referred to herein as "modules," "pluggable modules," "swappable modules," and the like), such as during online insertion and removal ("OIR") operations. Specifically, the heat sink assembly presented provides a movable or "floating" heat sink and an actuation assembly that can move the floating heat sink towards and/or away from a module cage included in a computing solution. In fact, the actuation assembly moves the entire heat sink away from the module cage (and/or a module installed therein), thereby reducing, if not eliminating, the risk of a module scraping against the heat sink assembly during insertion or removal operations.

In fact, the actuation assembly may move the heat sink so that the mating surface of the heat sink (e.g., a bottom surface) remains parallel to a heat transfer surface of a module (e.g., a top surface). Consequently, during insertion or removal of the module, the entire mating surface of the heat sink (e.g., the bottom surface) will be equally spaced apart from the heat transfer surface of the module (e.g., the top surface) by a gap and the module will not rub or slide against the mating surface of the heat sink. This gap, in turn, allows a thermal interface material ("TIM"), which would be damaged by sliding or rubbing, to be included on the mating surface. The TIM increases thermal conductivity between the heat sink and a module and, thus, improves cooling for the module. One benefit of parallel motion is that it helps ensure a substantially consistent gap between the heatsink and the module, thereby helping minimize the gap required to facilitate module removal.

Additionally or alternatively, the actuation assembly may move the heat sink along one degree of freedom (e.g., vertically). Moving the heat sink along one degree of freedom (e.g., vertically) may ensure that the heat sink does not need to be positioned adjacent open space, which is desirable when a heat sink moves in a lateral or depth direction (e.g., a front-to-back direction). Instead, the surface area of the heat sink size may be maximized to span a perimeter of a module and/or module cage and the cage need not be positioned with open space surrounding its peripheral boundaries. That is, moving the heat sink along one degree of freedom may maximize a thermal contact area. Furthermore, moving the heat sink along one degree of freedom may allow the heat sink to generate compression forces on a TIM (e.g., if the one degree of freedom is linear, vertical movement) that are often desirable to maximize TIM performance with the assembly that moves the heat sink. This may reduce the number of components in the assembly, reducing costs of manufacture and servicing. For example, this compression may eliminate the need for spring clips or other such biasing members that are expensive and prone to failure (thus, creating a need for servicing/replacement). As is explained in detail below, the actuation assembly may include rotational cams to maintain parallelism and/or to move the heat sink along one degree of freedom.

Moreover, the heat sink assembly presented herein may be actuated via rotations of a rotatable actuator. The actuator may allow for rotational actuations but may be otherwise fixed so that it is not moveable linearly along a front panel of a computing solution. Thus, the actuator may occupy a minimal amount of space on a front panel of a computing solution, which may be beneficial, if not required, for computing solutions with dense front panel layouts. Additionally, the actuator may lock the actuation assembly in a raised position or a lowered position, which may simplify insertion and removal of a module. This locking may also allow that the heat sink assembly presented herein to engage a module without spring clips or other such biasing members, which are relatively expensive and prone to failure, urging the two components into engagement. The actuator may provide this locking functionality without moving linearly, which would expand its footprint on the front panel.

In order to describe the heat sink assembly, apparatus, and system presented herein, terms such as "left," "right," "top," "bottom," "front," "rear," "side," "height," "length," "width," "upper," "lower," "interior," "exterior," "inner," "outer," "depth," and the like as may be used. However, it is to be understood that these terms merely describe points of reference and do not limit the present invention to any particular orientation or configuration. For example, the terms "height," "width," and "depth" may be used to describe certain embodiments presented herein, but it is to be understood that these terms are not intended to limit the present application to specific implementations. Instead, in at least some embodiments, the heat sink assembly presented herein may be oriented horizontally (as shown) or vertically (i.e., a housing of a computing solution may be rotated 90 degrees about an axis extending through a front and back of the housing), or in any other manner during use (e.g., when installed into a blade chassis/enclosure). Consequently, even if a certain dimension is described herein as a "height," it may be understood that this dimension may provide a width or depth when a computing solution in which it is included is moved to different orientations.

Now turning to FIG. 1A, this Figure schematically illustrates an example embodiment of a computing solution 10 that includes an example embodiment of the heat sink assembly 30 presented herein (for simplicity, at least some components of the heat sink assembly 30 are not shown in FIG. 1A). The computing solution 10 may also be referred to as a computing system; however, it is to be understood that the term "system," when used herein, does not imply that the solution/system 10 is a stand-alone system. Instead, a solution/system 10 may be a stand-alone system or a portion/subsystem of a larger system (e.g., solution 10 may be a blade of a server). That said, in FIG. 1A, the computing solution 10 includes an apparatus 12 and a removable computing module 20. The apparatus 12 includes a housing 14 that houses a printed circuit board (PCB) 16 and a module cage 18 (e.g., an optical cage). Additionally, the housing 14 houses a heat sink assembly 30 with a heat sink 31 and a thermal interface material (TIM) 35. The TIM 35 is included on a bottom surface of the heat sink 31 and, as is depicted, during insertion or removal of the computing module 20 into the module cage 18, the heat sink assembly 30 moves the heat sink 31 and TIM 35 away from the cage 18 to provide a gap "G" between the computing module 20 and the TIM 35.

In the depicted embodiment, the heat sink assembly 30 moves the heat sink 31 and the TIM 35 upwards. More specifically, the heat sink assembly 30 moves the entire heat sink 31 and entire TIM 35 upwards, away from the cage 18. In at least some embodiments, the heat sink assembly 30 moves the heat sink 31 and TIM 35 while keeping the TIM 35 parallel to a top of the cage 18. Alternatively, the heat sink 31 and TIM 35 might be moved upwards in any manner, but are moved into a raised position that is parallel to a top of the cage 18. Still further, in some embodiments, the TIM 35 is not parallel to the top of the cage 18 when in a raised position, but is spaced apart from the top of the cage 18 across its surface area (e.g., so that the gap G spans the whole TIM 35). Regardless of how the heat sink 31 and TIM 35 are moved to a raised position (and regardless of how the TIM 35 is oriented in its raised position), the gap G allows the computing module 20 to be inserted into or removed from cage 18 without contacting and damaging TIM 35. If, instead, only a portion of the TIM 35 was moved away from the cage 18 (e.g., if the heat sink assembly 30 was tipped about a lateral axis, which would extend into the plane of the drawing sheet on which FIG. 1A is included), the computing module 20 might contact and damage the TIM 35 (e.g., by scraping a portion of the TIM 35 off of the heat sink assembly 30).

Figure 1B:
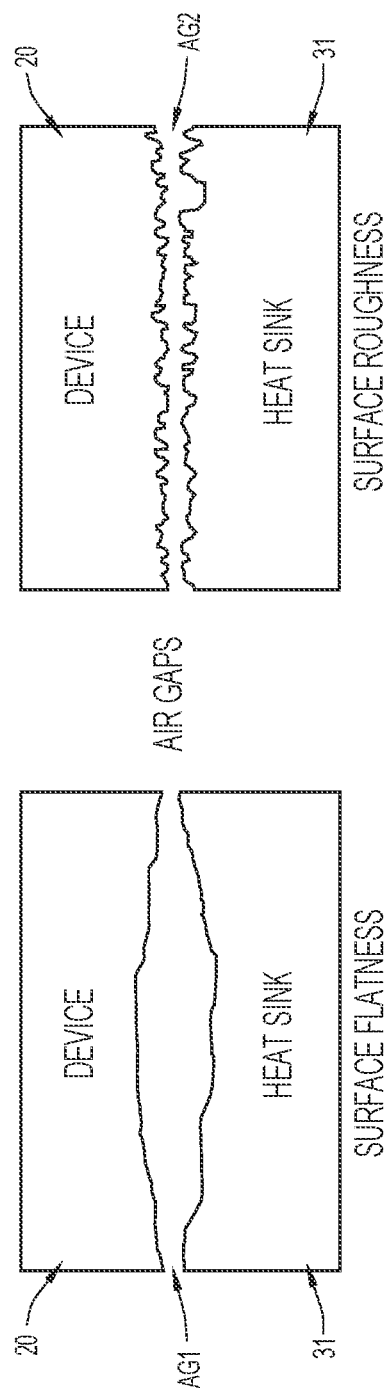
FIG. 1B is a diagram illustrating heat transfer between a field replaceable computing module and conventional heat sinks.

Alternatively, and now turning to FIG. 1B, if the heat sink assembly 30 does not include a TIM 35, a metal surface of a heat sink 31 included in the heat sink assembly 30 might not form an effective thermal connection with the computing module 20. For example, since metal surfaces (e.g., a bottom of a heat sink and/or top of a module) can have irregularities, such as flatness irregularities, waviness irregularities, roughness irregularities, etc., air gaps may form between the metal surfaces of a heat sink 31 and a computing module 20. In FIG. 1B, the left image illustrates air gaps AG1 that form between metal surfaces with surface flatness irregularities while the right image illustrates air gaps AG2 that form between metal surfaces with surface roughness irregularities. Notably, many riding heat sinks, which are often biased into contact with a module via spring clips that allow movement of the riding heat sink during insertion or removal of modules and press the heat sink against an installed module, provide inefficient heat transfer away from computing modules 20 due to air gap issues. These issues cannot be remedied by a TIM 35, because it would be scraped off or otherwise damaged as a heat sink "rides" on a sliding module. Regardless of how air gaps form between the module 20 and the heat sink assembly 30, air gaps are detrimental to heat transfer because the low thermal conductivity of air provides significant contact resistance. A TIM can reduce or eliminate these air gaps and significantly reduce contact resistance, especially if the TIM if compressed to a specific compression to maximize heat transfer (which may differ for different materials).

Figure 2:
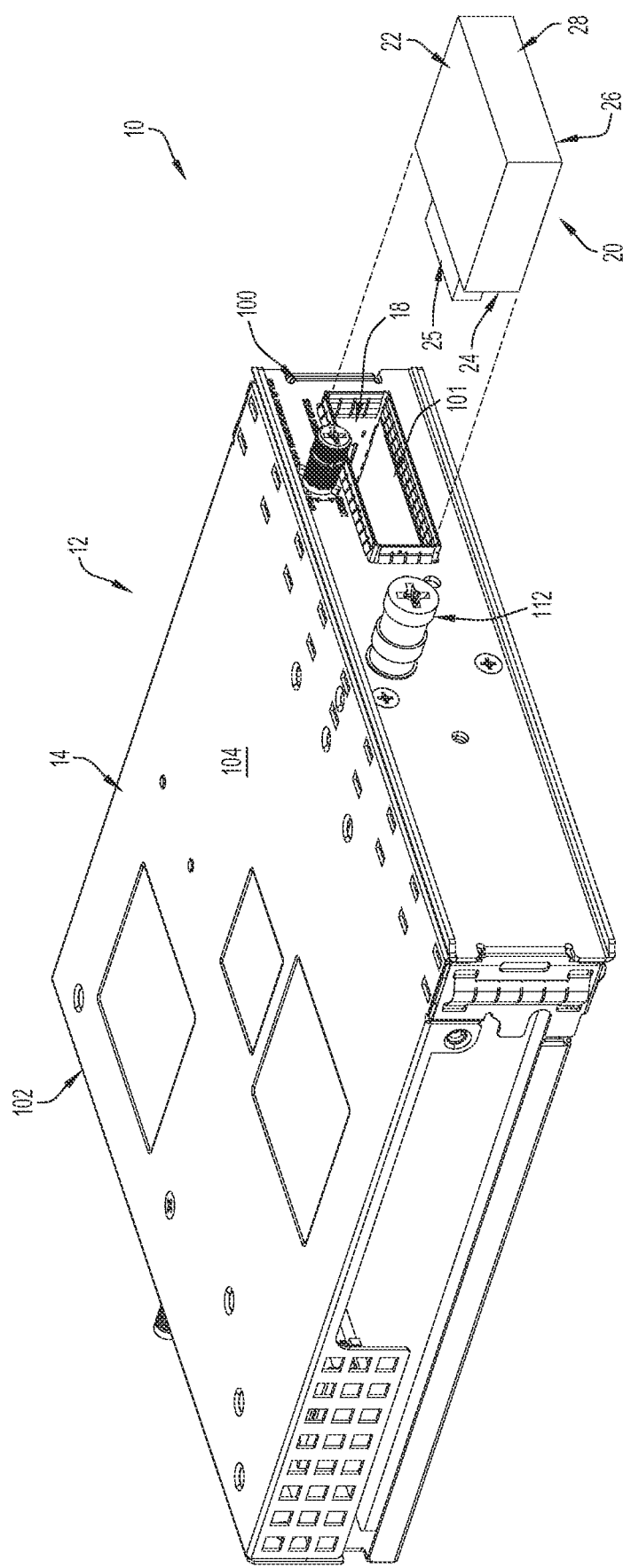
FIG. 2 illustrates a front perspective view of an example embodiment of a computing solution that includes an example embodiment of the heat sink assembly presented herein.

FIG. 2 illustrates a top perspective view of a computing apparatus 12 and a replaceable computing module 20 that may be installed within the apparatus 12 to form a computing solution 10. As is shown, the computing module 20 (which may also be referred to herein as a field replaceable computing modules, a pluggable computing module, a hot-swappable computing module, a module, and the like) includes a top surface 22, a back surface 24 with a connector 25, a bottom surface 26, and a front surface 28. As is discussed in further detail below, in the depicted embodiment, the top surface 22 of the computing module 20 is a heat transfer surface for the computing module 20. However, in other embodiments, any surface of the computing module 20 could serve as a heat transfer surface.

Meanwhile, the computing apparatus 12 includes a front surface or panel 100 with an opening 101 that provides access to the module cage 18 defined therein. In the depicted embodiment, the module cage 18 extends in a depth (e.g., front-to-back) direction within the housing 14 of the apparatus 12. That is, the module cage 18 extends from the front panel 100 towards a back end 102 of the housing 14. Additionally, in the depicted embodiment, the module cage 18 is arranged to be substantially flat within the housing 14, such that the module cage 18 is parallel to a cover 104 that defines a top of the housing 14.

Figure 3:
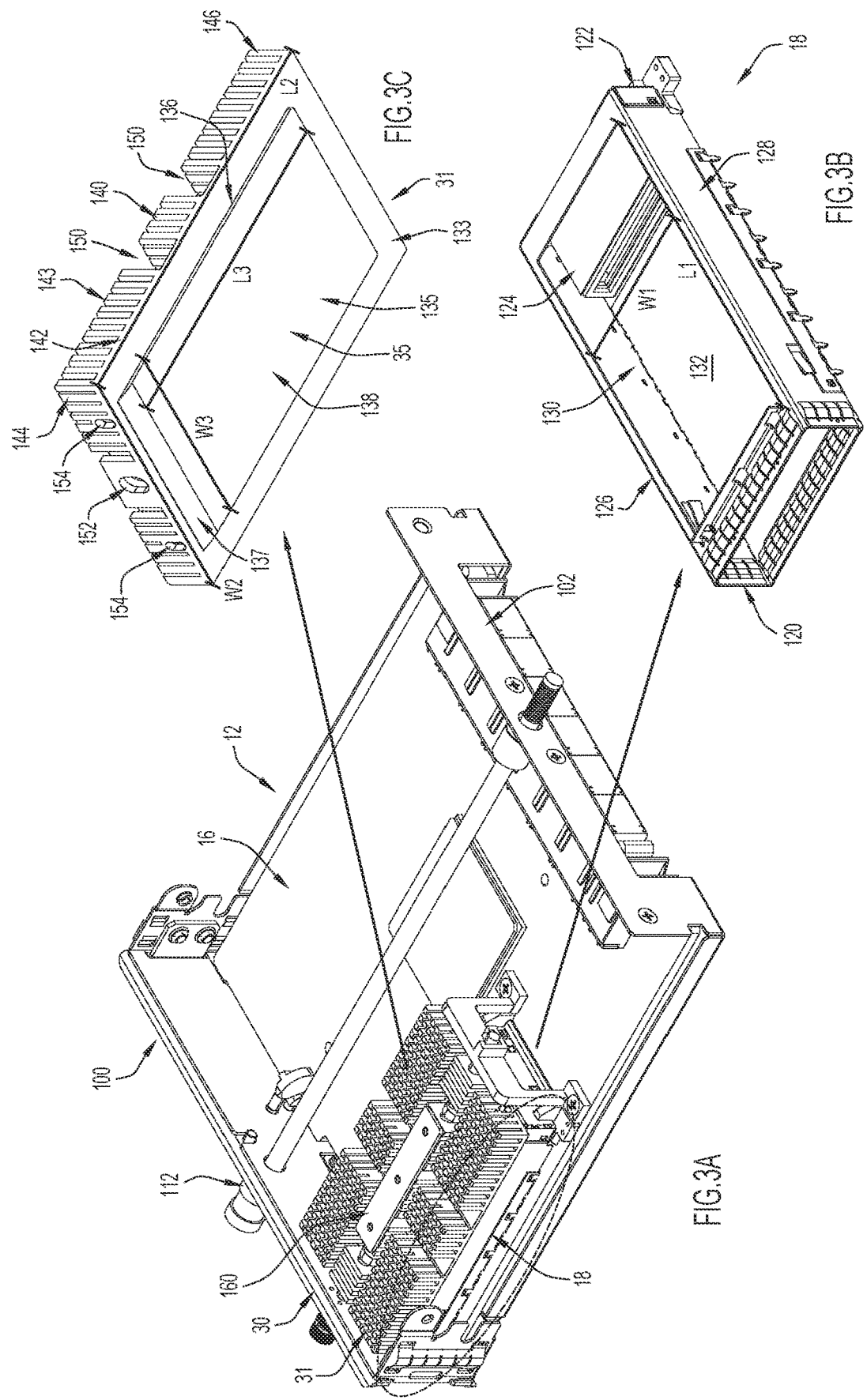
FIG. 3A illustrates a rear perspective view of the computing solution of FIG. 2 with a top cover of the computing solution removed to show the heat sink assembly, according to an example embodiment.
FIG. 3B illustrates a front perspective view of a module cage that is shown in the computing solution of FIG. 2, according to an example embodiment.
FIG. 3C illustrates a bottom perspective view of an example embodiment of a heat sink that may be included in the heat sink assembly shown in FIG. 2.

Accordingly, during insertion of the computing module 20 into the module cage 18, the perimeter of back surface 24 is aligned with the cage 18 and then the computing module 20 is pushed into the module cage 18 to connect the connector 25 on the back surface 24 with a connector 124 included in the cage 18 (see FIG. 3B). During removal of the computing module 20 from the module cage 18, the front surface 28 may be grasped and pulled out of the cage 18 (although not shown, the front surface 28 may include features, such as a flexible "tab", that enable a user to easily grasp the front surface 28). Alternatively, the computing module 20 can be ejected or removed from the module cage 18 in any manner now known or developed hereafter (including mechanical ejections). Before or after the computing module 20 is installed in the module cage 18, the housing 14 may be installed into another computing solution (e.g., a rack) and secured thereto with installation member 112 (see FIGS. 2 and 3A).

In FIG. 2, the computing solution 10 is a line card; however, it is to be understood that a line card is simply one example of a computing solution in which the heat sink assembly presented herein may be included. For example, the computing solution 10 could also be a rack server, a storage drawer, a stand-alone computing solution, or any other computing solution that accepts modular computing components (e.g., "field replaceable computing modules"). Likewise, in FIG. 2 (as well as many other figures), the module 20 is an optical transceiver, but it is to be understood that an optical transceiver is simply one example of a module with which the heat sink assembly presented herein may be used. That said, it may be beneficial to utilize the heat sink presented herein with optical transceivers because technical advancements in optical transceivers have generated high power dissipation (e.g., 25 W or more) in a small form factor (e.g., C form-factor pluggable 2 ("CFP2") form factor, which has dimensions of 41.5 millimeters ("mm")× 12.4 mm×107.5 mm (w×h×d)). These characteristics make it difficult to satisfy Network Equipment-Building System (NEBS) thermal standards for these modules.

Now turning to FIGS. 3A, 3B, and 3C, these Figures illustrate portions of the apparatus 12 in further detail. In FIG. 3A, the apparatus 12 is shown with its top cover 104 removed. With the top cover 104 removed, the heat sink assembly 30 can be seen disposed above the module cage 18. Meanwhile, FIG. 3B illustrates the module cage 18 removed from the housing 14 and FIG. 3C illustrates a heat sink 31 included in heat sink assembly 30 while removed from the apparatus 12. As can be seen in FIG. 3B, the module cage 18 extends from an open front end 120 to a back end 122. The back end 122 includes a connector 124 that may connect a computing module 20 to an apparatus 12 in which the module cage 18 is included (e.g., via PCB 16).

That is, the connector 124 may be configured to provide a Small Computer System Interface (SCSI) connection, Serial Attached SCSI (SAS) connection, an advanced technology attachment (ATA) connection, a Serial ATA (SATA) connection, and/or or any other type of connection for field replaceable computing modules.

Additionally, the module cage 18 extends from first side 126 to second side 128 and includes an open top 130. Collectively, the open front end 120, the back end 122, the first side 126, the second side 128, and the open top 130 define an internal chamber 132. That is, the open front end 120, the back end 122, the first side 126, the second side 128, and the open top 130 define a perimeter or periphery of chamber 132 (with sides 126 and 128 defining a lateral periphery while front end 120 and back end 122 defining a longitudinal periphery). The chamber 132 houses a computing module 20 and the open top 130 allows the heat sink assembly 30 to access and engage the top surface 22 (i.e., the heat transfer surface) of a computing module 20 installed within a chamber 132.

In different embodiments, the open top 130 may provide access to the chamber 132 in any desirable manner, such as via one or more windows, cut-outs, segments, etc. However, in the depicted embodiment, the open top 130 spans the entire surface area of the chamber 132, extending a length L1 from the open front end 120 to the back end 122 (e.g., in a front-to-back dimension) and a width W1 from the first side 126 to the second side 128 (e.g., in a lateral dimension). Thus, the depicted embodiment may maximize the area within which heat may transfer from the computing module 20 to the heat sink assembly 30.

In FIG. 3C, the heat sink 31 is shown from a bottom perspective view, which illustrates the TIM 35 that is included on a mating surface 133 of the heat sink 31. The TIM 35 includes a first surface 135 and a second surface 136. The second surface 136 is fixedly coupled to the mating surface 133 of the heat sink 31 (e.g., via adhesive, ultrasonic welding, etc.) and the first surface 135 is disposed opposite the second surface 136. Thus, the first surface 135 faces the open top 130 of the module cage 18 when the heat sink 31 is installed above the module cage 18. In at least some embodiments, the first surface 135 may include or be coated with a protective film that prevents the first surface 135 from sticking to a module 20. In the depicted embodiment, the first surface 135 and second surface 136 converge towards a front 144 of the heat sink 31 so that the second surface 135 includes a convergent section 137 and a flat section 138. However, in other embodiments, the first surface 135 and the second surface 136 need not converge and, for example, may be parallel to each other across the dimensions of the TIM 35.

Regardless of the shape of the TIM 35, the mating surface 133 of the heat sink 31 may have dimensions L2 (e.g., a front-to-back dimension) and W2 (e.g., width) that are at least as large as the corresponding top dimensions (L1 and W1, respectively) of the chamber 132 (defined by the open top 130) and a heat receiving portion of the TIM 35 (e.g., the flat section 138) may span or cover a majority of the mating surface 133. More specifically, the TIM 35 may span (e.g., cover) at least a depth or front-to-back dimension L1 of the open top 130 (which defines a depth of a top of the chamber 132). Additionally or alternatively, the TIM 35 may span a lateral dimension L2 of the open top (which defines a lateral dimension of a top of the chamber 132). For example, the flat section 138 of the TIM 35 may have a lateral dimension W3 (e.g., width W3) that is equal to or greater than W1 and/or the flat section 138 of the TIM 35 may have a front-to-back dimension L3 (e.g., depth L3) that is equal to or greater than L1. Consequently, the flat section 138 of the TIM 35 may cover as much of the computing module 20 as possible and maximize heat transfer between a computing module 20 and the heat sink 31.

Notably, with the heat sink assembly presented herein, the TIM 35 can span the entire surface area (e.g., L1 by W1) of the chamber 132 because, in at least some embodiments, the heat sink assembly 30 only moves the heat sink 31 vertically with respect to the module cage 18 (and a computing module 20 installed therein). If, instead, the heat sink 31 moved laterally or in a front-to-back direction, open space would need to be available to allow movement of heat sink 31. In some instances, this issue might be addressed by moving the heat sink 31 outside the peripheral boundaries of the module cage 18 (e.g., laterally beyond side 126 or 128). However, such movement would increase the footprint of the heat sink assembly 30, which is often undesirable, if not impossible, in high-density computing solutions.

Still referring to FIG. 3C, the mating surface 133 of the heat sink 31 forms a bottom of the heat sink 31 and fins 140 extend upwards therefrom. Specifically, the fins 140 and/or the mating surface 133 may include/define a base 142 and the fins 140 may extend from the base 142 to a top 143 of the heat sink 31. In the depicted embodiment, the fins 140 cover the base 142 between a front 144 and a back 146 of the heat sink 31 to maximize cooling and each of the fins 140 extends in a side-to-side direction across the heat sink 31 (with some fins being complete and other being incomplete to define cavities, channels, etc. as is described below). However, in other embodiments, the fins 140 may be arranged in any orientation or configuration. For example, the fin geometry, profile, and dimensions can be customized for different types of applications and airflow directions.

The fins 140 also define a number of openings, cavities, channels, etc. to accommodate portions of the heat sink assembly 30. In the depicted embodiment, the fins 140 define cavities 150 that extend laterally across at least a portion of the heat sink 31, as well as a through hole 152 and longitudinal channels 154 that extend in a front-to-back direction through the heat sink 31. The through hole 152 may extend completely through the heat sink 31, from the front 144 of the heat sink 31 to the back 146 of the heat sink 31. However, the longitudinal channels 154 need not extend completely through the heat sink 31 and, instead, may only be included on a predetermined number of fins 140 (e.g., one to four fins closest to the front 144 and one to four fins closest to the back 146). That said, in different embodiments, these features may have various shapes, orientations, arrangements, etc. to accommodate various components or features of the heat sink assembly 30.

Figure 4:
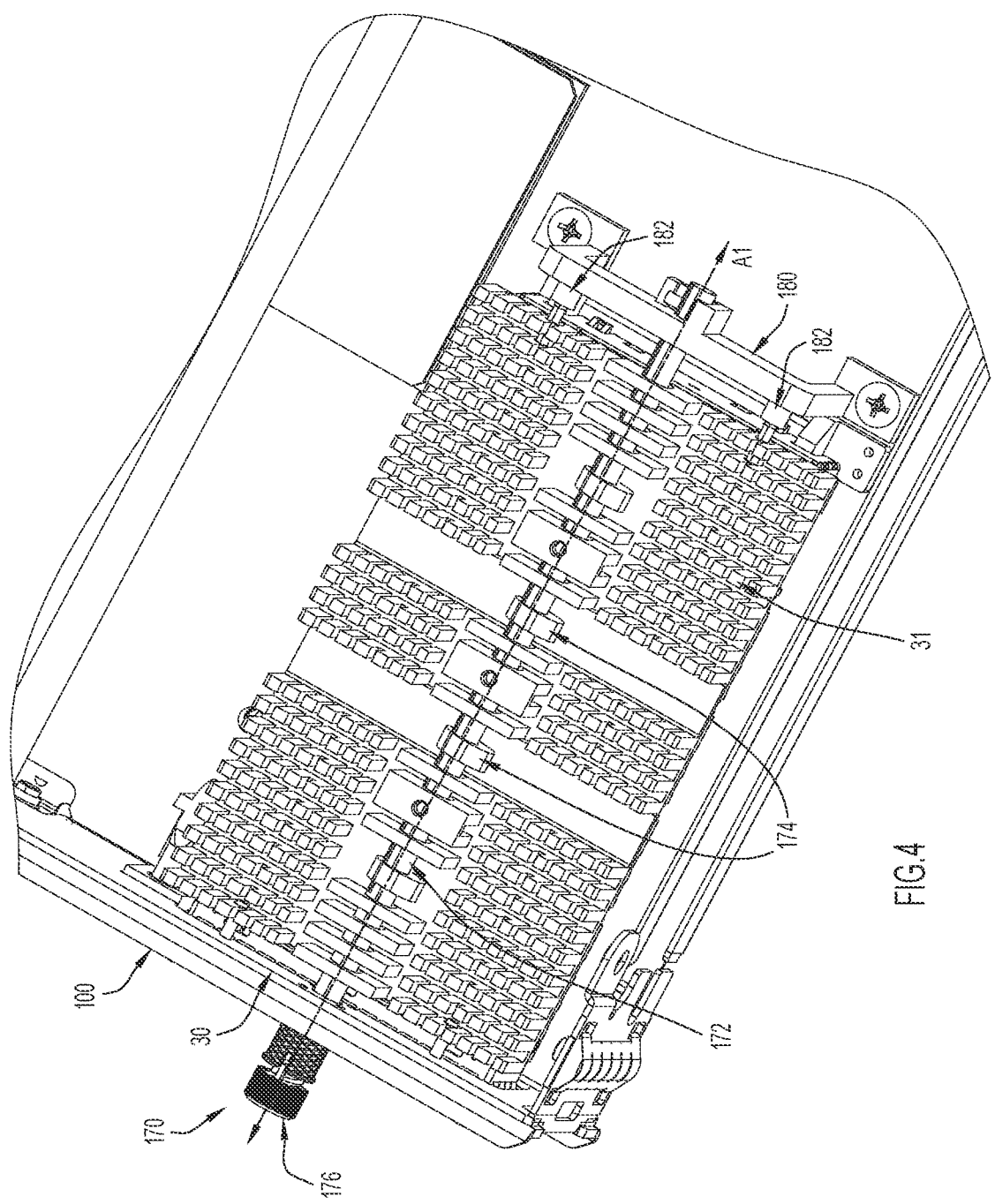
FIG. 4 illustrates a top, rear perspective view of the heat sink assembly of FIG. 2 with a cover of the heat sink assembly removed to expose an actuation assembly, according to an example embodiment.

Now turning to FIG. 4, but with continued reference to at least FIG. 3C, the heat sink assembly 30 also includes an actuation assembly 170. The actuation assembly 170 is disposed within the cavities, channels, etc. defined by the heat sink 31. Specifically, the actuation assembly 170 includes an axle 172 that extends through the through hole 152 and rotational cams 174 that are disposed in the cavities 150. The rotational cams 174 are mounted on the axle 172 so that rotating of the axle 172 about an axis A1 extending through the axle 172 causes the rotational cams 174 to rotate therewith. In the depicted embodiment, the actuation assembly 170 includes four rotational cams 174 spaced along the front-to-back dimension of the heat sink 31. However, in other embodiments, the heat sink assembly 30 may include any number of rotational cams 174. For example, the number of rotational cams 174 may be selected based on an overall size and weight of the heat sink 31. Regardless, the axle 172 also includes an actuator 176 that can be used to rotate the axle 172, as is explained in further detail below. As is shown in FIG. 3A, when the heat sink assembly 30 is fully assembled, at least a portion of the actuation assembly 170 is covered by a cover 160 that extends over the axle 172, and the rotational cams 174. The cover 160 is coupled to and moves with (e.g., floats with) the heat sink 31.

In the depicted embodiment, the through hole 152 is centrally aligned in the heat sink 31 (e.g., with respect to sides of the heat sink 31). However, in other embodiments, the through hole 152 can extend through any portion of the fins 140 so that the axle 172 extends through any portion of the fins 140, provided that that the axle 172 can still lift the heat sink 31 vertically away from the open top 130 of the module cage 18. For example, through hole 152 could extend through a side of the heat sink 31 in a front-to-back direction and the axle 172 could be rearranged accordingly. Moreover, in the depicted embodiment, the heat sink assembly 30 includes a single axle 172, but in other embodiments, the heat sink assembly 30 can include two or more axles 172 and the heat sink 31 can include a corresponding number of through holes 152. Likewise, in other embodiments, longitudinal channels 154 and/or cavities 150 could be rearranged in any desirable arrangement or configuration to accommodate different arrangements of rotational cams 174, guide pins (discussed below), or other such features.

Now turning to FIGS. 4, 5, 6A, 6B, 6C and 6D, the heat sink assembly 30 may include various features to support and/or control the actuation assembly 170 (alternatively, these features may be described as being part of actuation assembly 170). Specifically, the heat sink assembly 30 may include a rear support bracket 180 that can support a distal end of the axle 172 and the front panel 100 may include a main hole 190 to support a proximal end of the axle 172. Additionally, the bracket 180 may include or support back guide pins 182 that extend through the longitudinal channels 154 and restrict the heat sink assembly 30 to one degree of freedom. In some embodiments, the guide pins 182 extend entirely through the heat sink 31, but in at least the depicted embodiment, the guide pins 182 extend partially through the heat sink 31 (see FIG. 6C) and the heat sink assembly 30 also includes guide pins 192 that extend from the front panel 100, coaxially with guide pins 182 (see FIG. 6B). Put another way, in some embodiments, guide pins 192 and guide pins 182 may be parts of a pair of elongate elements, but in other embodiments, guide pins 192 and guide pins 182 may be distinct elements.

Moreover, although guide pins 182 and guide pins 192 are depicted as two pairs of coaxial guide pins, guide pins 182 and guide pins 192 need not be aligned an need not include the same number of pins. For example, guide pins 182 might include three pins spaced evenly across the width W2 of the fins 140 and guide pins 192 might include two pins spaced evenly across the width W2 of the fins 140 (and, thus, out of alignment with guide pins 182). The longitudinal channels 154 may be arranged in the fins 140 to match the configuration and orientation of guide pins 182 and guide pins 192 (and longitudinal channels 154 may extend through any front-to-back span of fins 140).

Figure 5:
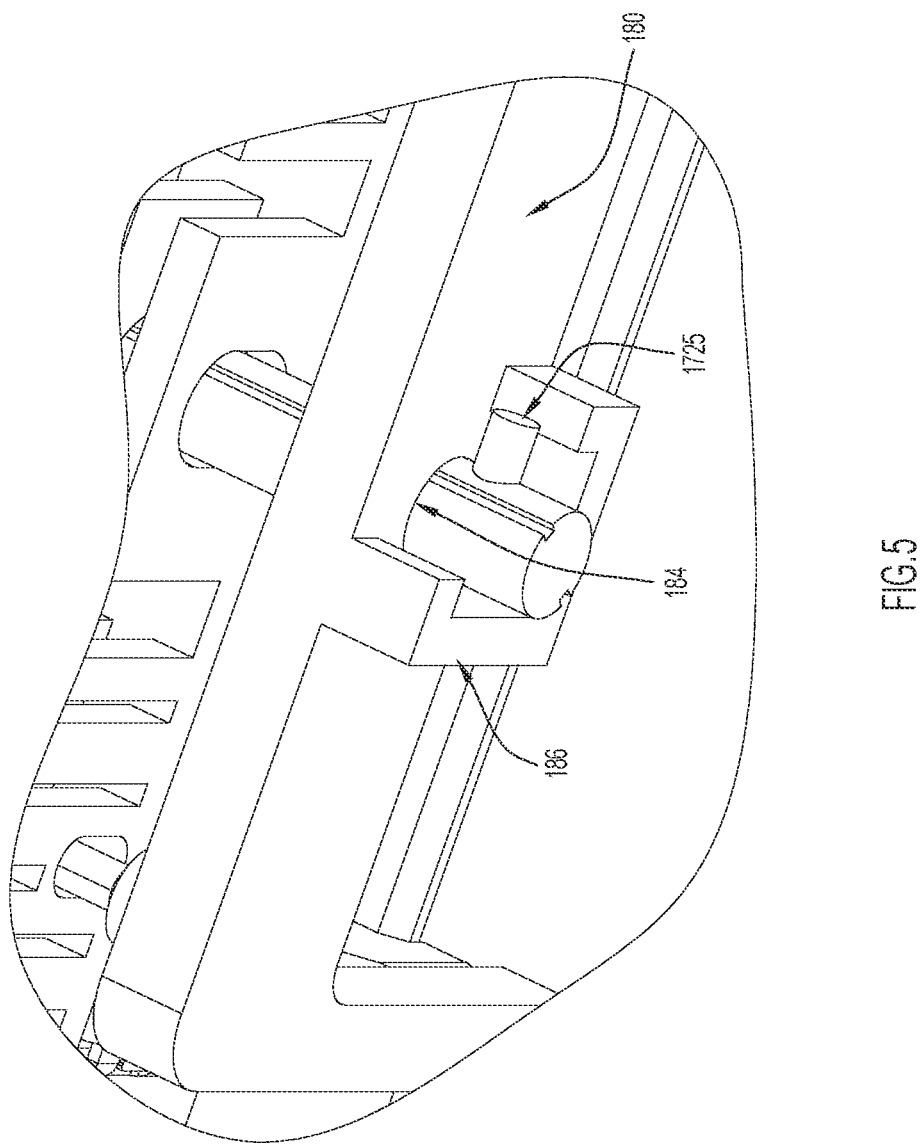
FIG. 5 illustrates a rear, detailed perspective view of the view shown in FIG. 4, according to an example embodiment.

Moreover, the main hole 190 may allow the axle 172 to rotate freely, but as is shown in FIG. 5, the back bracket 180 may include an axle receptacle 184 that is at least partially surrounded by a rotational limiter 186 that limits rotation of the axle 172 to a specific range of rotation. In the depicted embodiment, the rotational limiter 186 is a C-shaped member and the axle 172 includes a protrusion 1725 that sits in an opening defines by the C-shaped rotational limiter 186. This limits the axle 172 to a rotational span of approximately 90 degrees. However, in other embodiments, the rotational limiter 186 may take any form and may limit rotation of the axle 172 to any desirable range. Alternatively, the back bracket 180 need not include a rotational limiter 186 and the axle 172 may rotate freely or be restricted to a specific range in any other manner for restricting rotation now know or developed hereafter.

Figure 6D:
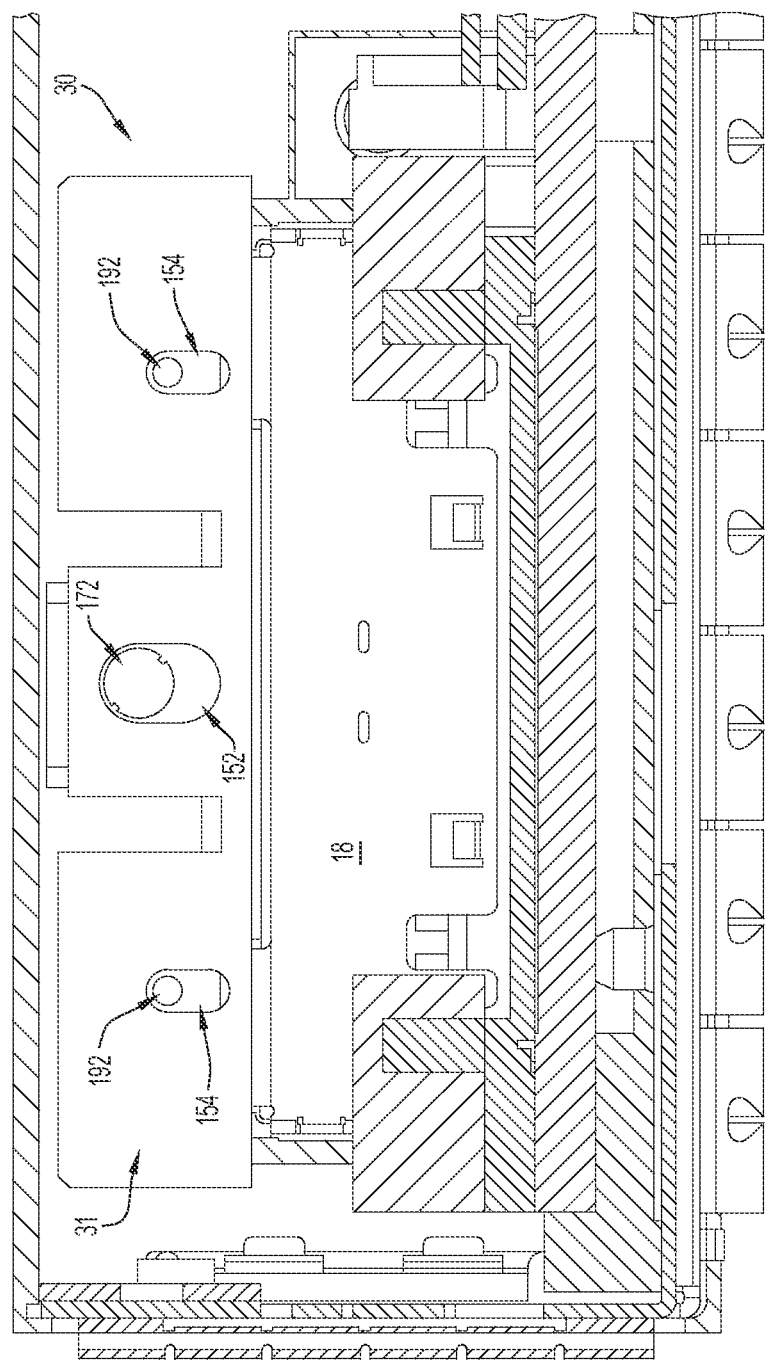
FIG. 6D illustrates a back view of the heat sink assembly shown in FIG. 2, according to an example embodiment.

As is shown in FIG. 6D, the longitudinal channels 154 have a width that closely corresponds to a width of guide pins 182 and/or guide pins 192, but extend vertically to allow guide pins 182 and guide pins 192 to move vertically therein. That is, longitudinal channels 154 are vertical slots with widths that match diameters of their corresponding guide pins 182, 192. Likewise, through hole 152 is a vertical slot with a diameter that matches the diameter of axle 172. Thus, collectively, longitudinal channels 154 and through hole 152 provide three slots that can restrict the axle 172 and the guide pins 182, 192 to one degree of freedom (e.g., linear movement with respect to the module cage 18). Thus, when rotational cams 174 rotate to cause the heat sink 31 to move with respect to the chamber 132 and/or open top 130 of the module cage 18, the heat sink 31 will move along one degree of freedom.

Figure 7:
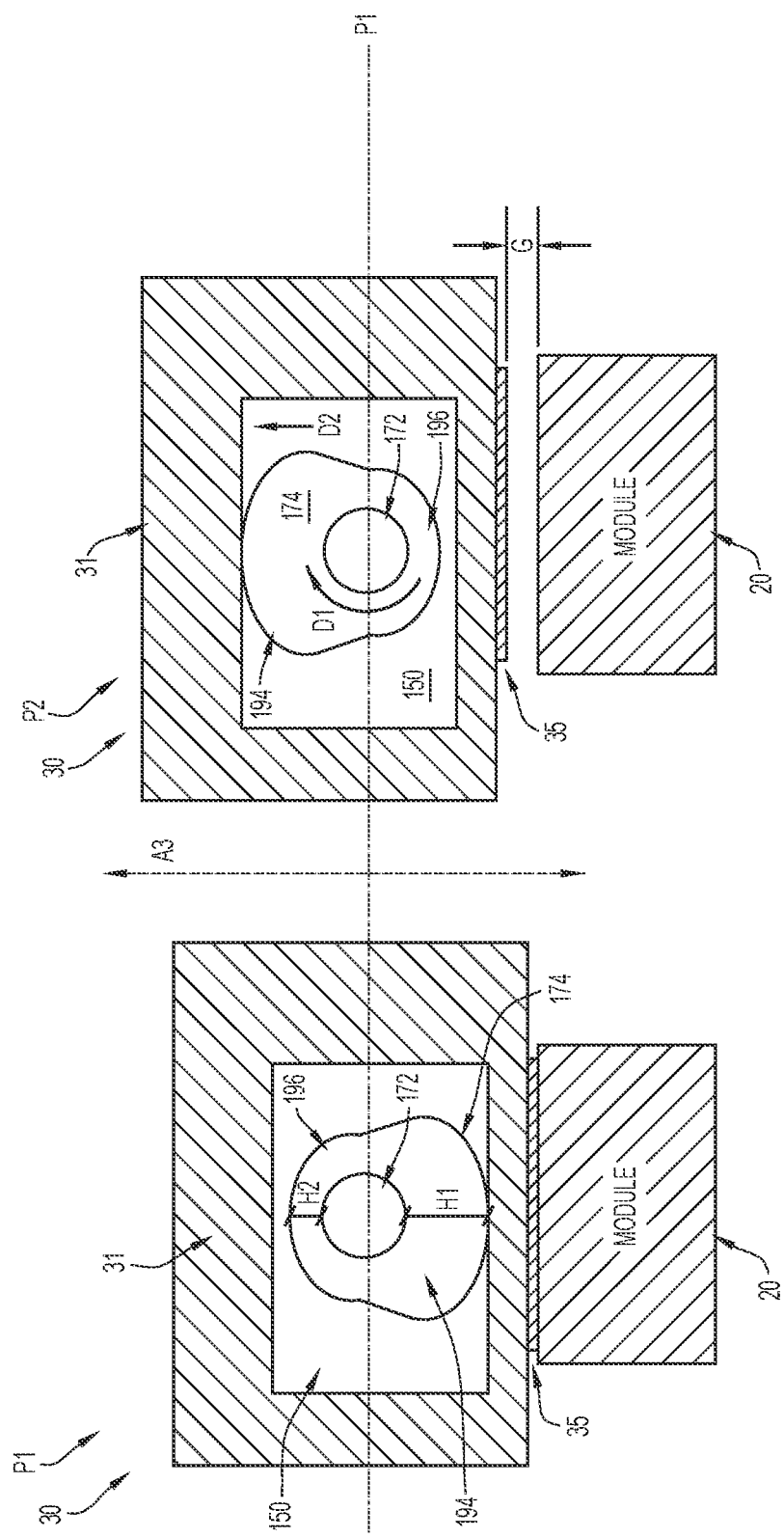
FIG. 7 is a diagram that schematically illustrates a portion of the actuation assembly included in the heat sink assembly presented herein, according to an example embodiment.

Now turning to FIG. 7, this Figure provides a schematic representation of the rotational cams 174 included in actuation assembly 170. The schematic representation does not show the exact embodiment from other Figures, but instead, is provided to illustrate functional operations of the rotational cams 174. For example, in the schematic diagrams of FIG. 7, the heat sink 31 may appear to encircle the cavities 150 within which the rotational cams 174 are installed; however, as is explained above, in at least some embodiments, a cover 160 may cover may seal a top of the cavities 150. Regardless, the rotational cams 174 may each be at least partially embedded within the heat sink 31 and may each include an elongated portion 194 and a short portion 196.

The elongated portion 194 has a maximum height H1 and the shortened portion 196 has a maximum height H2 that is smaller than height H1. Collectively, heights H1 and H2 may span a majority of the height of cavity 150 and the elongated portion 194 may consistently exert pressure on the heat sink 31 to move the heat sink 31 to different positions. Specifically, when the rotational cams 174 are in a rest position P1, the elongated portion 194 may engage a bottom surface of its cavity 150, pushing the heat sink 31 downwards along vertical axis A3. Then, when the rotational cams 174 are rotated from a rest position P1 to an actuated position P2, the rotational cams 174 push the heat sink 31 upwards along vertical axis A3.

In the depicted embodiment, the rotational cams 174 may rotate approximately 180 degrees in direction D1; however, this is just a schematic example and at least some embodiments (including embodiments presented herein) may provide actuation in response to a 90 degree rotation in direction D1 (or 90 degrees in a direction opposite direction D1). Further, the rotational cams 174 may have a profile that is specified or "tuned" to provide non-constant vertical motion with respect to angular rotational position. This may be advantageous, for example, to provide an initially rapid downward motion of the heat sink, followed by a more gradual "seating" of TIM 35 onto the module 20. Additionally or alternatively, the profile can be tuned so that, in their rest positions P1, the rotational cams 174 provide a specific compression of the TIM to maximize heat transfer (e.g., tuned for a specific TIM material) without requiring additional components (e.g., spring clips) to create compression. However, some embodiments might also include additional components (e.g., springs or other biasing members) to increase the compression force generated by vertical movement if desired.

As mentioned, the features of the heat sink assembly 30 (and specifically, the actuation assembly 170) may restrict the heat sink assembly 30 to one degree of freedom. Thus, as the rotational cams 174 move between positions P1 and P2, the rotational cams 174 may only move the heat sink 31 vertically with respect to a module cage 18 (and, if installed, a computing module 20 installed in the module cage 18). Thus, when the rotational cams 174 are moved from their rest position P1 to their actuated position P2, the heat sink may move a distance D2 upwards along axis A3, creating a gap G (e.g., 2-3 millimeters) between the computing module 20 and the TIM 35. Notably, the axle 172 remains fixed in a horizontal plane P1 during movements of the rotation cams 174 and the rotational cams 174 drive vertical movement of the heat sink 31, which is essentially floating on the rotational cams 174, with respect to plane P1. Thus, the heat sink 31 may sometimes be referred to as a floating heat sink 31.

In the depicted embodiment, the elongated portion 194 and the shortened portion 196 each have rounded edges. Additionally, the elongated portion 194 has an outward taper and the short portion 196 tapers slightly inwards. These shapes may smooth movements of the heat sink 31 as the rotational cams 174 move between the rest position P1 and the actuated position P2 while providing structural integrity. However, the dimensions and shapes of the elongated portion 194 and short portion 196 may vary in different embodiments (and FIG. 7 is only a schematic representation). Regardless, the rotational cams 174 create the gap G between the entire TIM 35 and the module cage 18 (and a computing module 20 installed therein). Thus, a computing module 20 can be inserted into or removed from the module cage 18 without damaging the TIM 35.

In particular, when the rotational cams 174 are in their actuated position P2 (such that gap G is provided between the TIM 35 and the module cage 18), a computing module 20 can be installed or removed from the module cage 18. In at least some embodiments, the gap G may be consistent across the surface area of the TIM 35 (e.g., an area defined by W3 and L3), such that the TIM 35 (or at least a portion thereof) is parallel to the cage 18 and/or the computing module 20 (i.e., the heat sink assembly 30 may provide uniform lifting). In any case, after a computing module 20 is installed in module cage 18, the rotational cams 174 may be moved to their rest position P1, which may move the TIM 35 into engagement with a heat transfer surface of the computing module 20 (e.g., top surface 22). In fact, in some embodiments, moving the rotational cams 174 to their rest positions P1 may compress the TIM 35 against the heat transfer surface of the computing module 20 (e.g., top surface 22), further encouraging heat transfer. This compression can be achieved without springs or other such biasing member (and, instead, may be achieved with mechanical locking, as is described below). Alternatively, the compression could be supplemented or enhanced with biasing members, if desired. Biasing might also remove axle and cam backlash.

Figure 8:
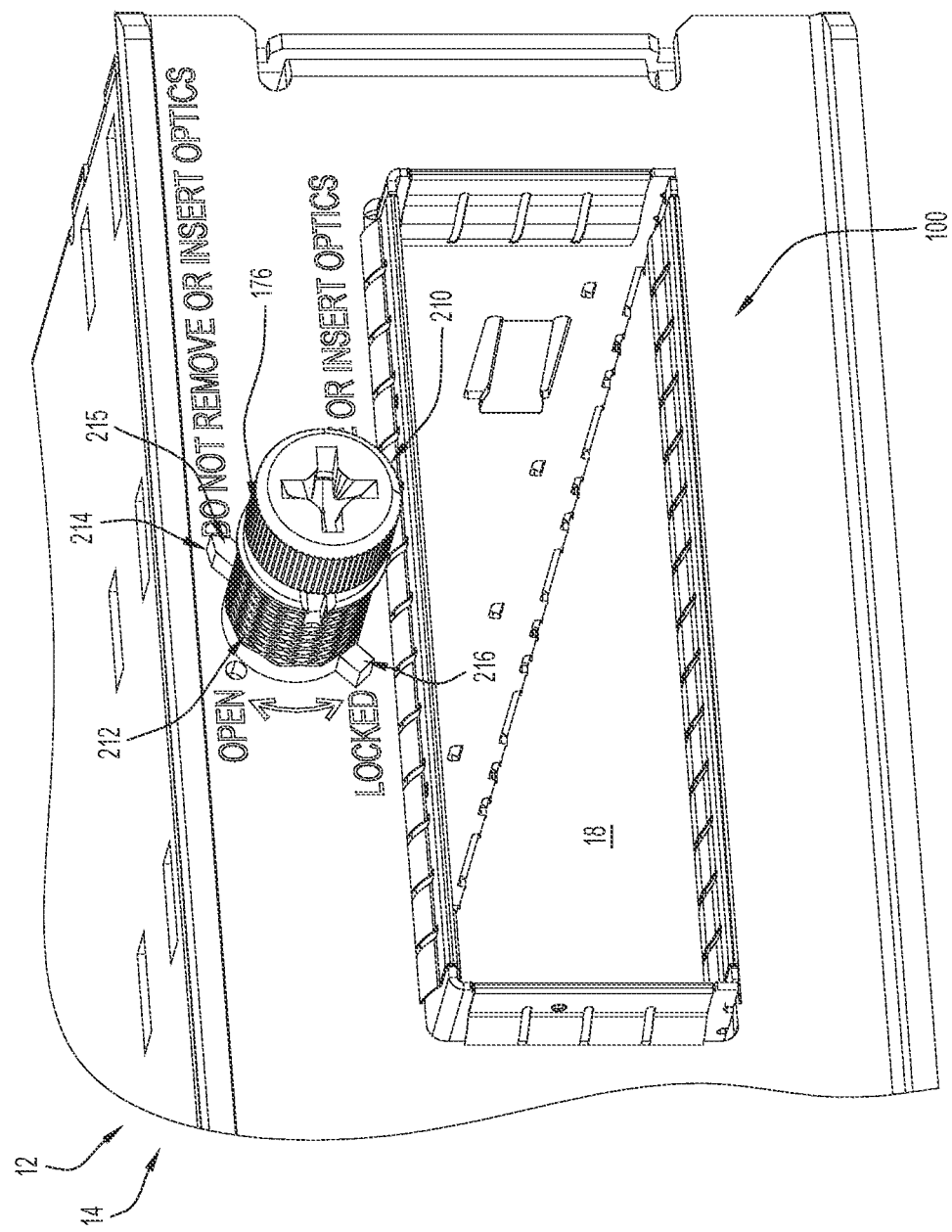
FIG. 8 illustrates a front perspective view of a portion of an exterior of the computing solution of FIG. 2, according to an example embodiment.

Now turning to FIGS. 8, 9A, and 9B, the actuation assembly 170 includes an actuator 176 that is coupled to or formed integrally with axle 172. The actuator 176 includes a fixed portion 210 and a rider 212. The rider 212 is movable longitudinally (e.g., in a front-to-back or depth direction) along the fixed portion 210 and is configured to rotate with the fixed portion 210. Additionally, in the depicted embodiment, the rider 212 includes an indicator 214 with a head end 215 and a tail end 216 so that the indicator 214 can point to two different indicia on the front 100 in response to a single rotation of actuator 176. Still further, in the depicted embodiment, the tail end 216 of the indicator 214 includes a lock member 217 (see FIG. 11) that can selectively engage locking apertures 198 and 199 in the front panel 100 to lock the heat sink assembly 30 into different positions.

Specifically, as is shown in FIG. 9A, when the actuator 176 is an open position P3, the lock member 217 may engage second locking aperture 199 (see FIG. 9B) to lock the rotational cams 174 in actuated positions P2. Additionally, when the actuator 176 is in the open position P3, the tail end 216 of indicator 214 may be aligned with first open indicia 1992 while the head end 215 of indicator 214 is aligned with second open indicia 1993, each of which indicate that the cage is open (for example, by indicating "open" and "remove or insert optics"). By comparison, and is shown in FIG. 9B, when the actuator 176 is a closed position P4, the lock member 217 may engage first locking aperture 198 (see FIG. 9A) to lock the rotational cams 174 in rest position P1. When the actuator 176 is in closed position P4, the tail end 216 of the indicator 214 is aligned with first closed indicia 1982 while the head end 215 of indicator 214 is aligned with second closed indicia 1983, each of which indicate that the cage is closed (for example, by indicating "closed" and "do not remove or insert optics").

However, the depicted embodiment is only one example and in other embodiments, the rider 212 may include any desirable indicator and may lock in any desirable manner. For example, the rider 212 need not lock the actuation assembly 170 into specific positions and the actuation assembly 170 may include other features or components that provide locking. Further, actuator 176 may include features, such as a metallic tab or fingers that provide a visibly apparent locking feature that prevents module removal in the "locked" state. As another example, in addition to or in lieu of the depicted indicia, the front panel 100 may include lights (e.g., light emitting diodes (LEDs)) that are actuated by rotation of the actuator 176. Specifically, in at least some embodiments, the lock member 217 could activate one or more actuators or switches when inserted into locking apertures 198 and 199 and the one or more actuators or switches could operate a light to provide an illuminated indication (e.g., a red light or a green light) on the front panel 100.

FIG. 9C is a schematic diagram that represents circuitry that might be used for lights (e.g., LEDs) included on the front panel. Circuitry 1990 includes a light 1991, a switch 1995, and a power source 1996. The power source 1996 can be a dedicated battery or any power source included in or connected to a computing solution in which the heat sink assembly 30 is installed. With this circuitry, lock member 217 could engage switch 1995 to turn on light 1991. In some embodiments, light 1991 could turn on when the lock member 217 is one position (e.g., in aperture 199) and off when lock member 217 is another position (e.g., in aperture 198). Alternatively, circuitry 1990 could have any other configuration that allows one or more switches to activate light 1991 in one or more colors. For example, circuitry 1990 could be reconfigured to illuminate light 1991 different colors when lock member 217 is different positions or the circuitry 1990 could be duplicated, with one circuit providing a light for on and one circuit providing a light for off. That is, circuitry is merely a representative schematic and the lock member 217 or another component of heat sink assembly 30 could cause actuation of a light in any manner now know or developed hereafter.

Figure 10A:
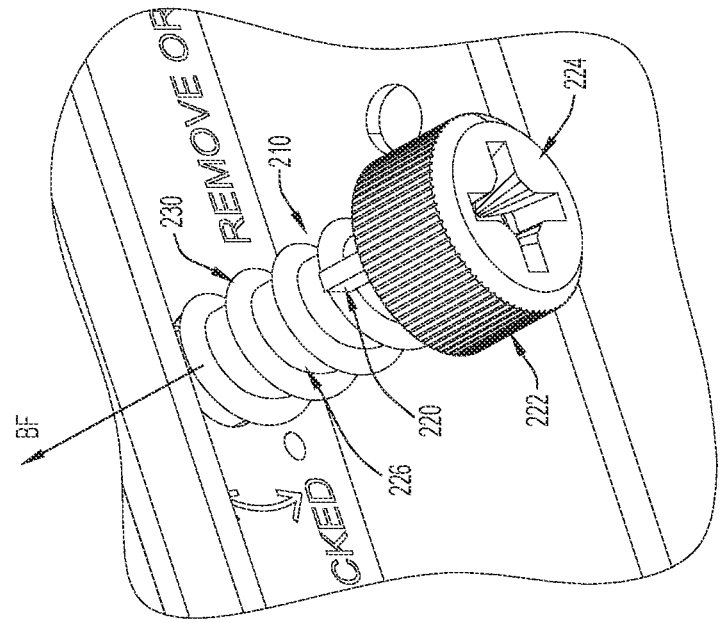
FIGS. 10A and 10B illustrate perspective views of the actuator from FIGS. 9A and 9B, with a rider being removed from the actuator in FIG. 10B, according to an example embodiment.
Figure 10B:
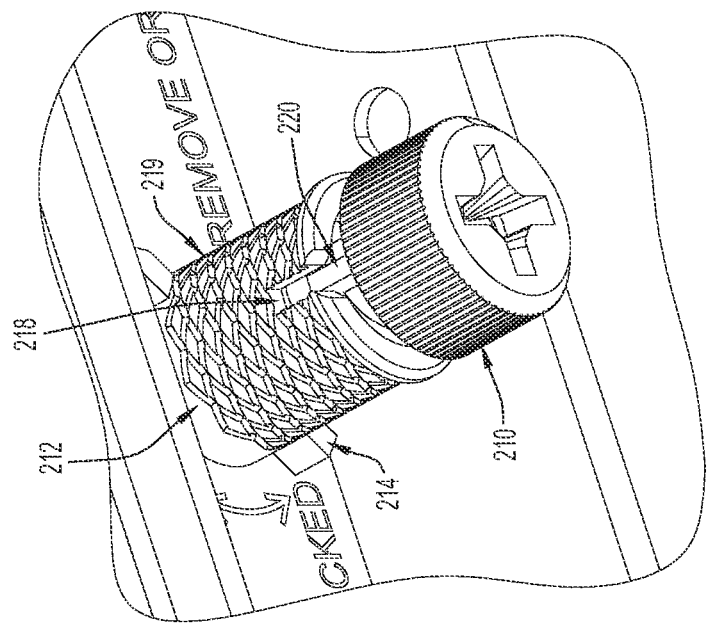

Now turning to FIGS. 10A and 10B, in the depicted embodiment, the rider 212 is movable longitudinally (e.g., in a front-to-back or depth direction) along the fixed portion 210, but still configured to rotate with the rider 212. This is because the rider 212 includes a slit 218 that is engaged with, but slidable on a locking flange 220 of the fixed portion 210. The rider 212 also includes a grip 219 (e.g., a knurled portion) that allows a user to grasp and move the rider 212. If, for example, a user grasps and rotates the rider 212 via grip 219, the slit 218 pushes the locking flange 220 of the fixed portion 210 and causes the fixed portion 210 to rotate with the rider 212. In at least some embodiments, a head portion 222 of the fixed portion 210 includes a screw head 224 so that the actuator 176 can be rotated via the grip 219 or the head portion 222.

Meanwhile, if, for example, a user grasps the rider 212 via grip 219 and moves it longitudinally along an elongate section 226 of the fixed portion 210, the slit 218 is long enough to remain engaged with the locking flange 220 over the range of longitudinal motion provided to the rider 212. The range may be defined as the difference between the length of rider 212 and the distance between the front panel 100 and a head portion 222 of the fixed portion 210. Consequently, the rider 212 and the slit 218 are sized to allow for longitudinal movement of the rider 212 along the elongate section 226 of the fixed portion 210 that does not disengage the slit 218 from the locking flange 220. Additionally, in at least some embodiments, the actuator 176 includes a biasing member 230 that can exert a biasing force BF on the rider 212 towards the front panel 100. Thus, the biasing member 230 may urge the lock member 217 of the indicator 214 (on the rider 212) into engagement with locking apertures 198 and 199 (to selectively lock heat sink assembly 30) and the longitudinal play of the rider 212 may allow the lock member 217 to be disengaged from apertures 198 and 199 (to selectively unlock heat sink assembly 30).

FIG. 11 illustrates a method 200 of operating the actuator 176 to move the actuation assembly 170 from a first position where the TIM 35 is engaged with a computing module 20 (e.g., corresponding with position P1 of rotational cams 174) to a second position where the TIM 35 is spaced from a computing module 20 and/or a module cage 18 (e.g., corresponding with position P2 of rotational cams 174). In the first step, the actuator 176 is in its closed position P4, with the lock member 217 engaged with first locking aperture 198. In the second step, the rider 212 is pulled outwards along the elongate section 226, in direction D3, with enough force to overcome the biasing force BF exerted by biasing member 230 and disengage the lock member 217 from first locking aperture 198. Then, in a third step, the rider is held in the position shown in the second step and the actuator 176 is rotated in direction D4 to move the lock member 217 into alignment with second locking aperture 199 (e.g., rotated 90 degrees). As mentioned above, the rider 212 and the fixed portion 210 will rotate together, regardless of which component receives a rotational force. In the fourth step, the lock member 217 is aligned with the second locking aperture 199 and the rider 212 is released. Upon release of the rider 212, the biasing force BF of the biasing member 230 will urge the rider 212 towards the front panel 100 and move the lock member 217 into engagement with second locking aperture 199.

Overall, during method 200, the rotation shown in the third step will move the TIM 35 away from a computing module 20 and/or a module cage 18 (creating a gap G). Meanwhile, engaging lock member 217 with second locking aperture 199 will selectively lock the TIM 35 in a raised position. Meanwhile, when the lock member 217 is engaged with the first locking aperture 198, the actuator 176 selectively locks the TIM 35 in contact with a computing module 20 and/or a module cage 18. Notably, a spring (or other such biasing member) is not required to act on the TIM 35 (or heat sink 31) to lock the TIM 35 in either position. Instead, a spring is used to bias the actuator (and, in some embodiments, need not be used at all). Consequently, the heat sink 31 can be secured in a cooling position without using spring clips that may be expensive and prone to failure.

Moreover, during the method 200, the actuator 176 does not need to move linearly along the front panel 100 in any direction to actuate the heat sink assembly 30. Instead, the actuator 176 remains fixed in a single location on the front panel 100 and receives rotational actuations. Thus, the actuator 176 may minimize its footprint on the front panel 100 and will provide limited, if any, interference with other components on or adjacent to the front panel 100, including components of other computing solutions installed adjacent computing solution 10.

Now turning to FIGS. 12A-16, these Figures depict additional embodiments of the heat sink assembly presented herein, or at least of portions thereof. In these Figures, components that are similar to components shown in FIGS. 1-11 are labeled with like reference numerals and, any description of like reference numerals included above should be understood to apply to like components included in FIGS. 12A-16. Thus, for brevity, the foregoing description focuses on differences between the embodiments.

Figure 12A:
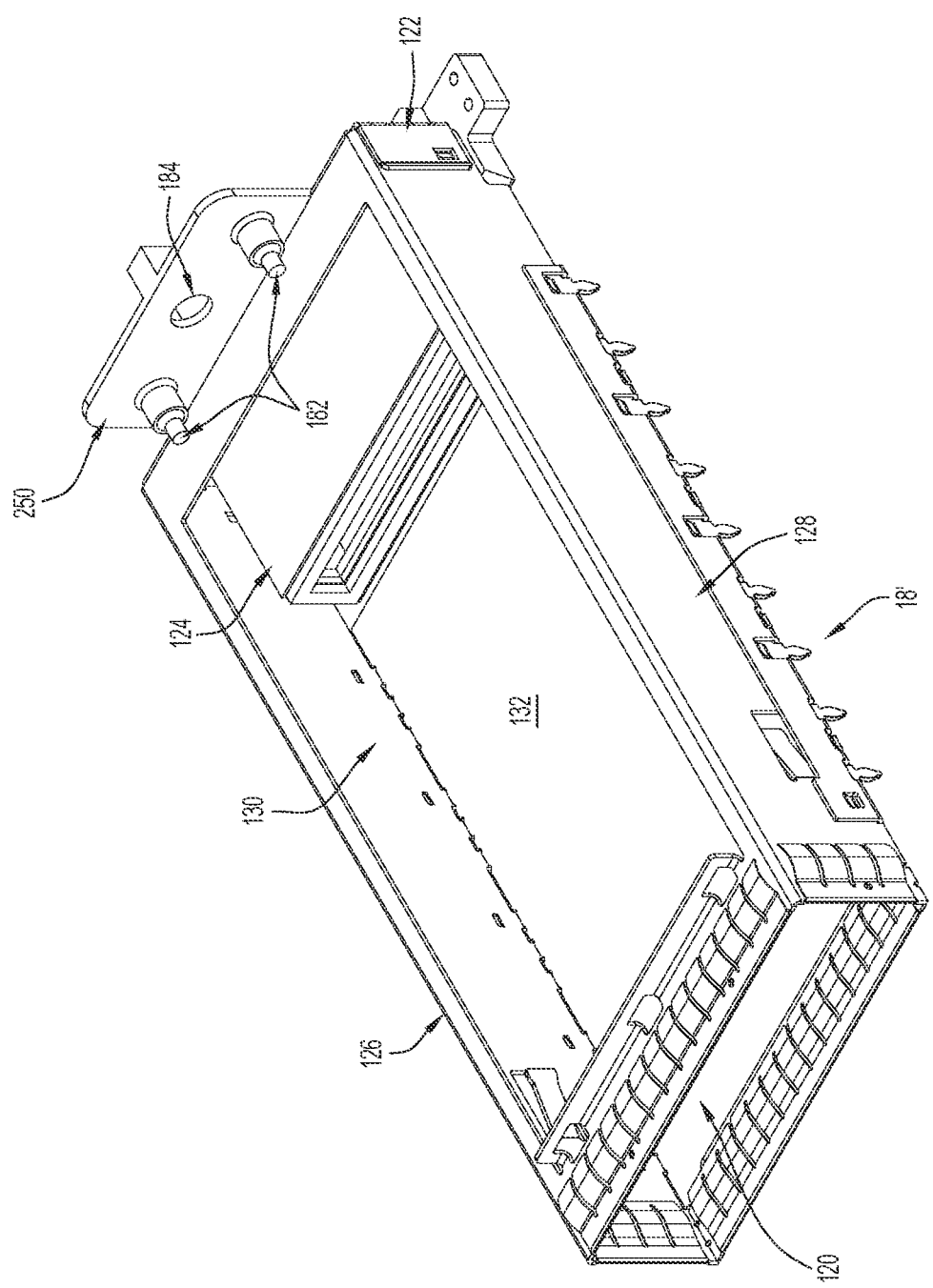
FIG. 12A illustrates a front perspective view of another example module cage that may be included in the computing solution of FIG. 2, according to an example embodiment.
Figure 12B:
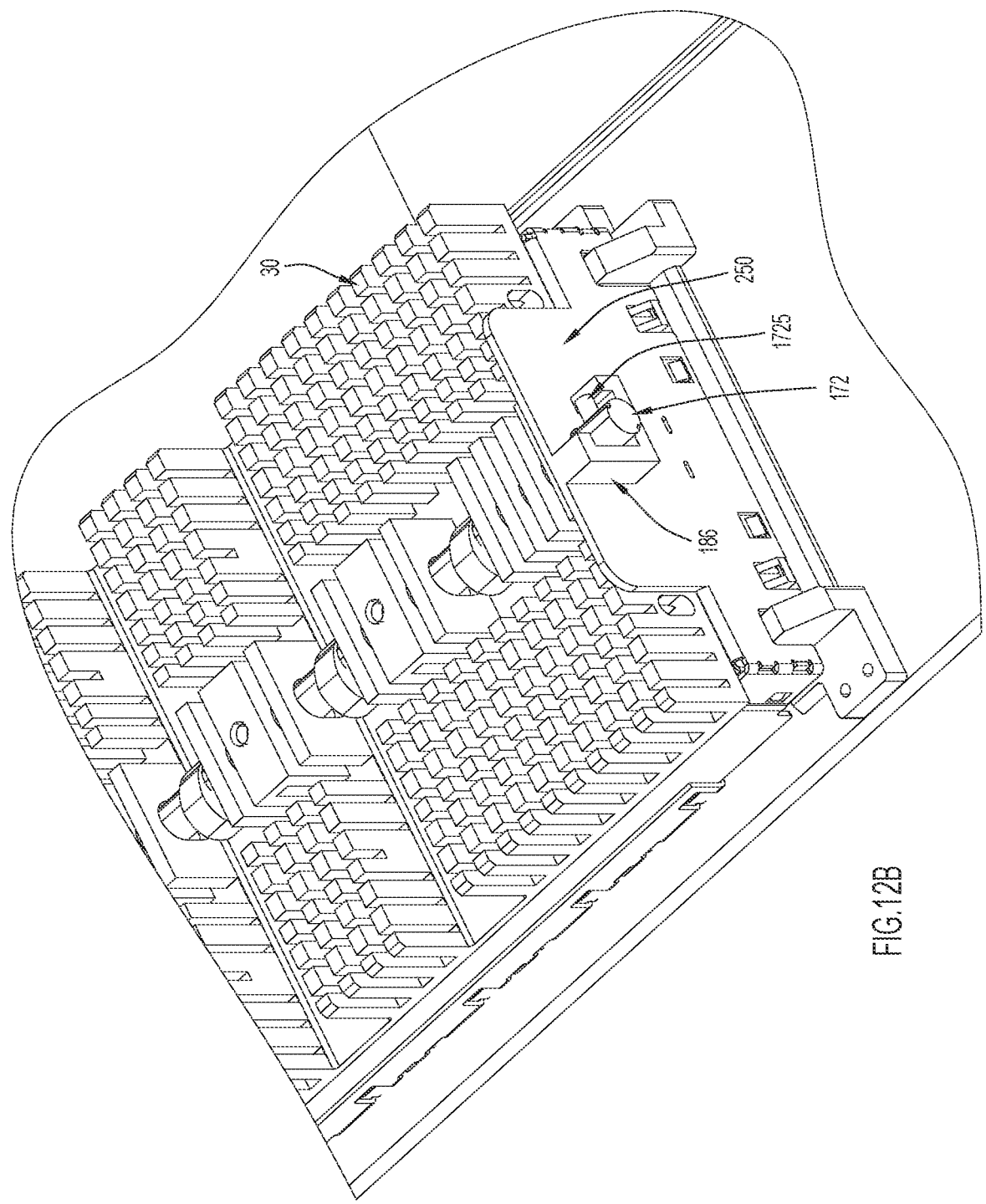
FIG. 12B illustrates a rear perspective view of the module cage of FIG. 12A installed in the computing solution of FIG. 2, according to an example embodiment.

For example, FIGS. 12A and 12B illustrate another example embodiment of a module cage with which the heat sink assembly 30 presented herein may be utilized. The module cage 18' is substantially similar to the module cage 18 shown in FIG. 3B and, thus, like reference numerals are used to denote similar parts and, for brevity, the foregoing description focuses on differences between the embodiments. Most notably, in this embodiment, the module cage 18' includes a back bracket 250 that extends upwards from the back end 122 of the module cage 18'. The back bracket 250 still includes guide pins 182 (see FIG. 12A) and a rotational limiter 186 (see FIG. 12B), but now the back bracket 250 need not be mounted to the PCB 16. Positioning the bracket 250 on the cage 18 instead of the PCB 16 may free up more space on the PCB 16 which, as mentioned, is highly valuable in high-density computing components.

Next, FIGS. 13A and 13B illustrate yet another example embodiment of a module cage with which the heat sink assembly 30 presented herein may be utilized. The module cage 18" is similar to the module cage 18' shown in FIGS. 12A and 12B and the module cage 18 of FIG. 3B. Thus, for brevity, the foregoing description again focuses on differences between the embodiments with like reference numerals are used to denote similar parts. Most notably, in this embodiment, the module cage 18" a main body formed from a first portion 252 and a second portion 254 that are removably coupleable to each other. In the depicted embodiment, the first portion 252 and second portion 254 each include overlapping flanges that can be secured together with fastener (e.g., machine screws); however, in other embodiments, the first portion 252 and second portion 254 can be removably coupled together in any desirable manner. The two-piece body may ensure the cage 18" can be installed in tight spaces, such as ganged cages.

The first portion 252 includes the open front end 120 and portions of sides 126 and 128, but now also defines a receptacle 256 for the axle 172 that can support a proximal end of the axle 172, either instead of or in addition to the main hole 190 included on the front panel 100 (the proximal end of the axle 172 will still be connected to the actuator 176 through the front panel 100, but the hole 190 need not support the axle 172). Meanwhile, the second portion 254 includes portions of sides 126 and 128 and the back end 122. Like module cage 18', the second portion 254 of module cage 18" includes/defines a bracket 258 that extends upwards from its back end 122; however, bracket 258 has a reduced profile as compared to bracket 250. Additionally, bracket 258 might not include guide pins (e.g., like guide pins 182 in FIG. 12A), but still includes a rotational limiter 186 to engage an axle protrusion 172S and limit rotation of the axle 172. Thus, again, back bracket 258 need not be mounted to the PCB 16 and may free up more space on the PCB 16, which, as mentioned, is highly valuable in high-density computing components. In the depicted embodiment, the first portion 252 includes pegs 259 to mount the cage 18" to PCB 16, but in other embodiments, cage 18" may include any other type of mounting component (such as the unlabeled mounting components shown in FIG. 12A).

Overall cage 18" may provide a robust support for the heat sink assembly 30 presented herein and may maintain alignment of components of the heat sink assembly 30 (e.g., of actuation assembly 170) regardless of the overall environment (i.e., regardless of the computing solution 10 in which heat sink assembly 30 is included). Additionally, one or both of the first portion 252 and second portion 254 can be tuned or adjusted to adapt cage 18" for specific environments.

Figure 14B:
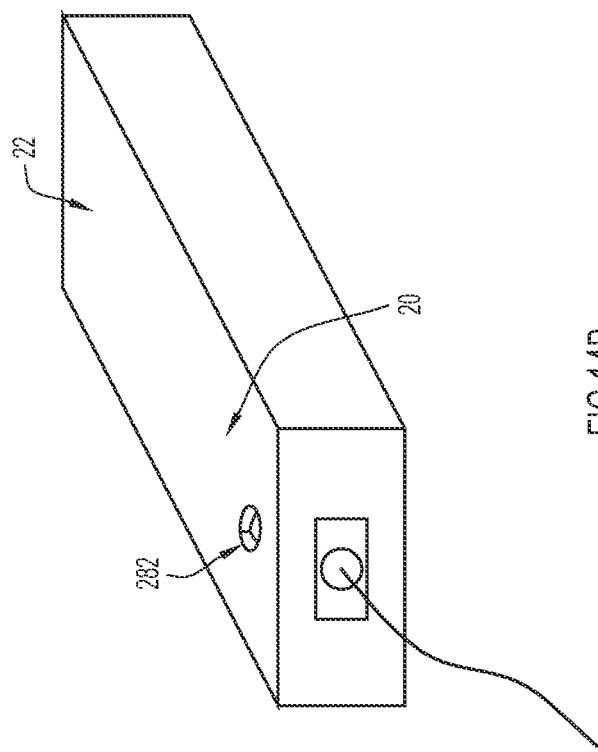
FIGS. 14A and 14B illustrate perspective views of a field replaceable computing module and heat sink, respectively, with which the heat sink assembly presented herein may be utilized, according to another example embodiment.
Figure 14A:
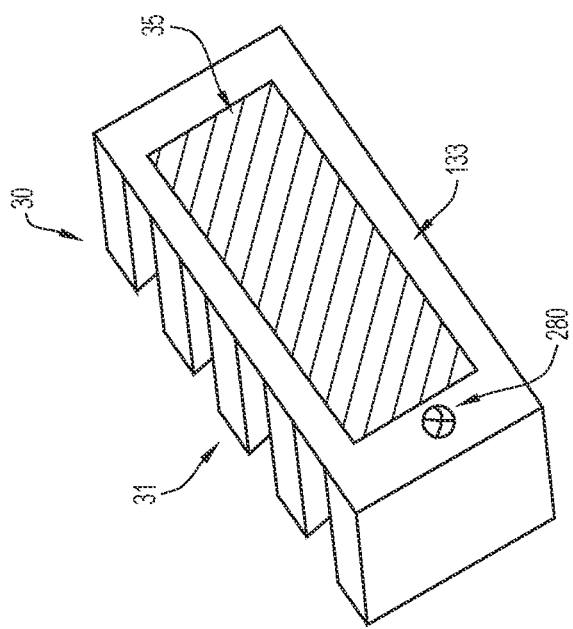

FIG. 14A depicts an embodiment of a heat sink assembly 30 that includes a locking feature that can be used in addition to or as an alternative to the locking provided by actuator 176. Specifically, in this embodiment, the heat sink assembly 30 includes a protrusion 280 positioned forwardly of the TIM 35 on the mating surface 133 of the heat sink 31 (e.g., closer to the open front end 120 of the module cage 18). With this embodiment, and as is shown in FIG. 14B, the computing module 20 includes a corresponding receptacle 282 configured to mate with the protrusion 280 when the computing module 20 is fully installed into a module cage 18. Then, when the heat sink assembly 30 moves the TIM 35 into engagement with the top surface 22 of the computing module 20, the protrusion 280 will engage the receptacle 282 and resist movement in the front-to-back direction. Thus, if the computing module 20 is pulled outwardly prior to the heat sink assembly 30 moving the TIM 35 out of engagement with the top surface 22 of the computing module 20, the protrusion 280 and the receptacle 282 may resist this movement and prevent damage to the TIM 35. This arrangement will also ensure that module is not forcefully inserted or extracted which could cause an unintentional damage for the TIM.

Figure 15:
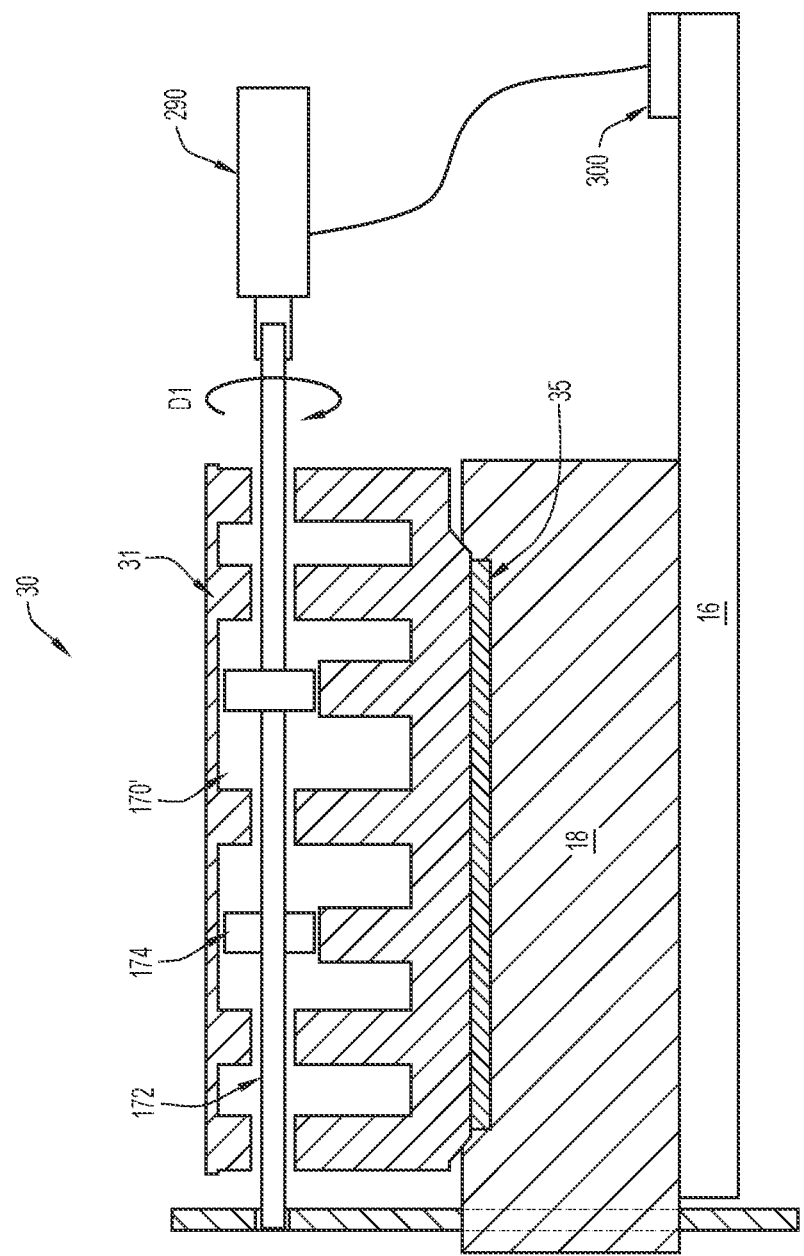
FIG. 15 illustrates a side sectional view of a motorized embodiment of the heat sink assembly presented herein.

FIG. 15 illustrates a sectional view of an embodiment including a linear or rotational actuation motor 290 that is engaged with the actuation assembly 170 and that may automate actuation of the heat sink assembly 30. The actuation motor 290 may be controlled by a processor 300, which may execute non-transitory computer readable instructions to cause actuations of the actuation assembly 170 at predetermined times and/or in response to a user input. Thus, in at least some embodiments, the heat sink assembly 30 presented herein may provide fully automated control of heat sinks for field replaceable modules. Moreover, the processor 300 could control a light indication on the front panel 100 to indicate the position of the heat sink 31.

Figure 16:
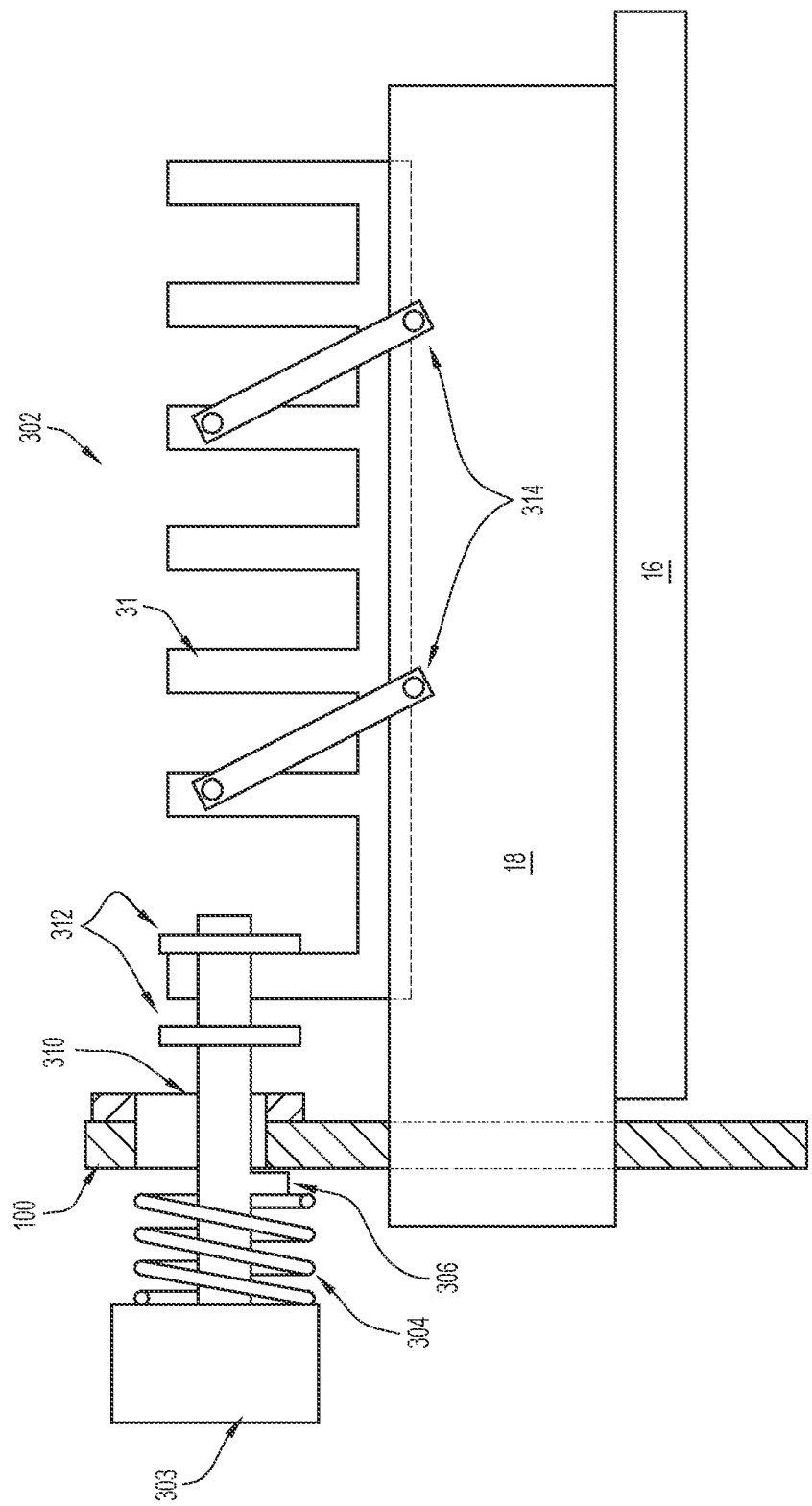
FIG. 16 illustrates a side view of a linkage assembly with which the heat sink assembly presented herein may be utilized, according to an example embodiment.

FIG. 16 illustrates a sectional view of an embodiment including a four-bar linkage 302 that can be used in combination with the rotational cams 174 of the actuation assembly 170 presented herein. For example, the four-bar linkage 302 could be used to increase the weight capacity of the actuation assembly 170, to increase a compression force generated by the actuation assembly 170 (e.g., of the TIM 35 against a module 20), and/or to increase stability of the actuation assembly 170. However, the four-bar linkage 302 is only one example of a component that can provide these advantages and, in other embodiments, other mechanical components, arrangements, or assemblies could be used with or instead of the four-bar linkage 302. For example, a torsion spring could be added to the four-bar linkage 302 to help ensure sufficient contact pressure between TIM 35 and heat transfer surface 22 of the computing module 20. Alternatively, the actuation assembly 170 may provide suitable weight capacity, compression force, and/or stability on its own, and thus, may not require additional mechanical components, arrangements, assemblies, etc.

That said, when a four-bar linkage 302 is used in combination with the rotational cams 174, the actuator 303 may need to be a push-pull, rotatable actuator to allow for vertical movement caused by the four-bar linkage 302. A spring 304 may bias the actuator 303 outwardly and a pin 306 may engage a main slot 310 formed in the front panel 100 of an apparatus 12 to lock the four-bar linkage in different positions. Specifically, after the actuator 303 is rotated to clear the pin 306 from its first locking position (which is illustrated), the actuator 303 may be pushed inwards and heat sink engagement members 312 may engage the heat sink engagement members 312 to push heat sink 31. Linkage members 314 may convert this linear motion into vertical and linear movement that moves the TIM 35 towards or away from the module cage 18. The pin 306 can then be rotated upwards (180 degrees from its shown position) to lock against an internal surface of front panel 100. Then, to lower the heat sink 31, the procedure is reversed. To accommodate movement of actuator 303 with the heat sink 31, the main slot 310 may be widened as compared to the main hole 190 used for actuation assembly 170. Among other advantages, the four-bar arrangement may ensure substantially coplanar heat sink motion while reducing the number of actuating cams, thereby reducing actuation friction and system complexities.

Figure 17:
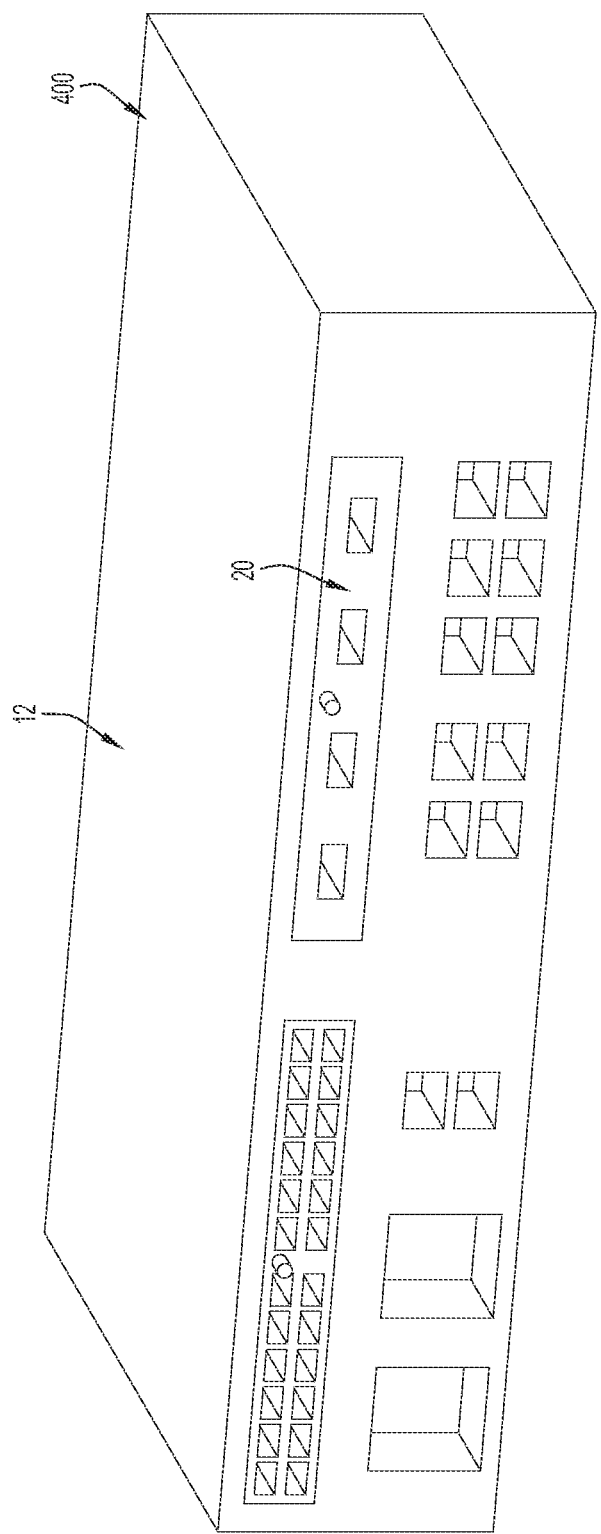
FIGS. 17 and 18 illustrate front perspective views of example embodiments of computing solutions and computing modules with which the heat sink assembly presented herein may be utilized.
Figure 18:
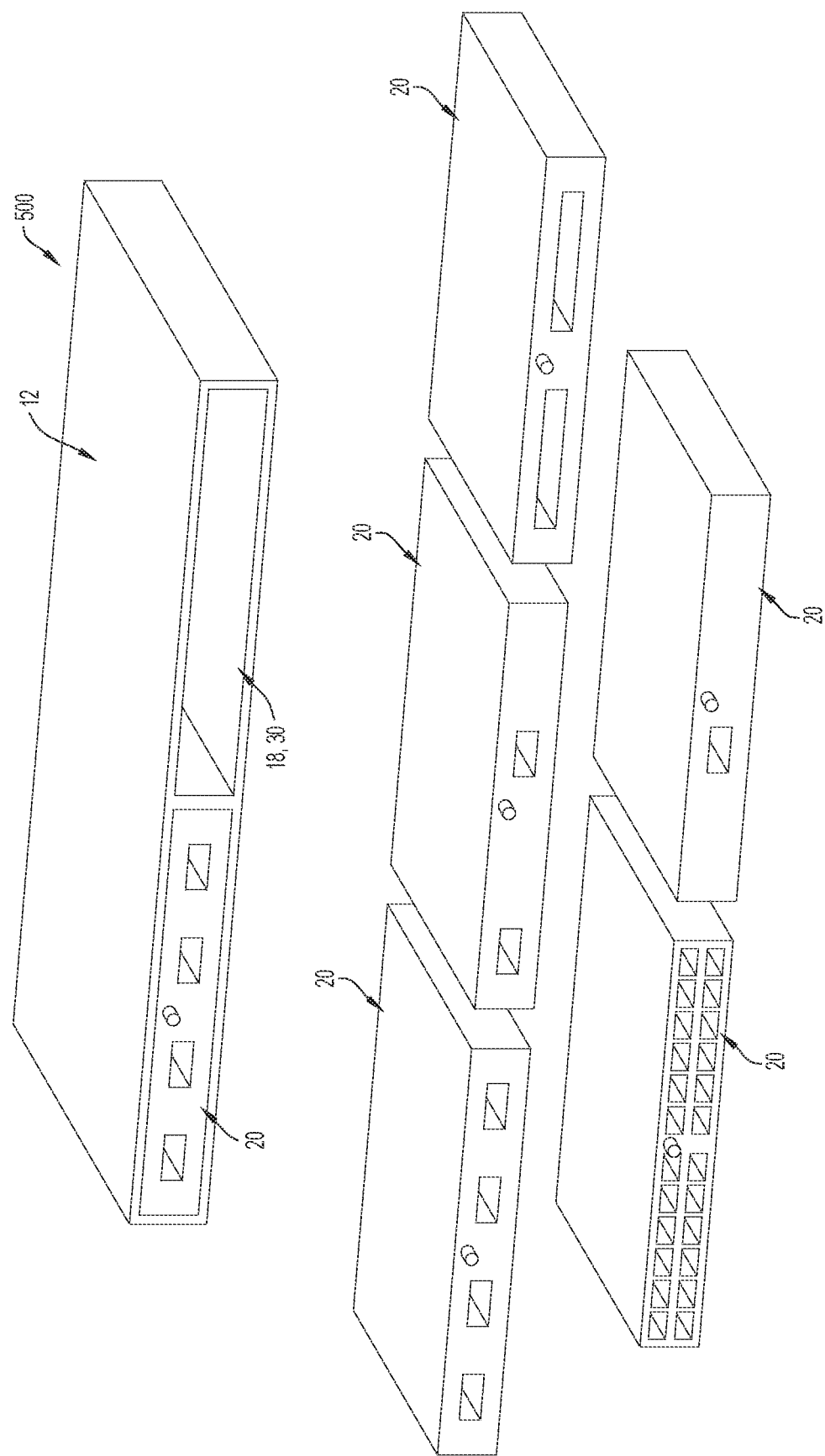

Now turning to FIGS. 17 and 18, these Figures illustrate example solutions that can utilize the heat sink assembly 30 presented herein. First, in FIG. 17, system 400 is a server or switch assembled in an apparatus 12 that is a pizza-box style chassis. The apparatus 12 includes a cage to receive a module 20 in the form of a modular port adapter (MPA). This provides flexibility for customer-based specializations and the heat sink assembly 30 presented herein can provide cooling for any MPA. Second, FIG. 18 illustrates a solution 500 with an apparatus 12 in the form of an MPA that can support computing modules 20 in the form of CFP2 optical transceivers. In this instance, the heat sink assembly 30 can be installed in the MPA to provide cooling for the CFP2 optical transceivers. Then, if the MPA was installed in, for example, a line card, the line card might also include a heat sink assembly 30 formed accordance with the embodiments presented herein to cool the MPA within the line card.

Now turning to FIG. 19, among other advantages, the heat sink assembly presented herein may provide for improved cooling of computing modules and/or a reduced footprint (at least because a heat sink may cover an entire computing module without moving beyond a lateral periphery of a computing module). Diagram 600 illustrates the temperature improvements provided by the heat sink assembly 30 as compared to a heat sink 31 that is not modified to support the actuation assembly 170 of heat sink assembly 30 (e.g., a heat sink 31 of the same size, but without the features (including the TIM 35) of heat sink assembly 30 described herein). Notably, the heat sink assembly 30 presented herein achieves lower temperatures under the same airflow conditions. For example, the heat sink assembly 30 may cool a module case to 70 degree Celsius with approximately 9 cubic feet per minute (CFM) of airflow while the unmodified heat sink requires approximately 12 CFM to achieve the same temperature. Thus, the heat sink assembly 30 may provide approximately 25% improvement.

Moreover, the thermal data from diagram 600 indicates that the heat sink assembly 30 does not induce thermal spreading that mitigates improvements in contact resistance provided by the TIM 35 engaging the computing module 20. That is, forming cavities 150, through hole 152, and longitudinal channels 154 in heat sink 31 will not generate thermal spreading that counteracts the thermal effectiveness of the heat sink 31. Thus, the heat sink assembly presented herein may support higher operational temperatures while still meeting regulatory standards. Additionally or alternatively, the heat sink assembly presented herein may reduce operating temperatures which may power consumption (e.g., due to reduced fan speeds) and/or reduce acoustic noise (e.g., from fans). The heat sink assembly presented herein may also achieve these advantages with an inexpensive solution that, for example, does not require expensive and maintenance intensive spring clips.

In summary, an apparatus is provided comprising: a cage defining a chamber; a heat sink including fins to facilitate heat dissipation and a mating surface positioned at a base of the fins; a thermal interface material including a first surface and a second surface, the first surface being coupled to the mating surface of the heat sink and the second surface being opposite the first surface so that the second surface can be positioned against a perimeter of the chamber; and an actuation assembly including a rotational cam, wherein when the rotational cam is in a first position, the second surface of the thermal interface material is disposed within or adjacent the perimeter of the chamber, and when the rotational cam moves to a second position, the second surface of the thermal interface material is moved a distance away from the perimeter of the chamber.

In another form, a heat sink assembly for a cage for a field replaceable computing module is provided, comprising: a heat sink including fins to facilitate heat dissipation and a mating surface positioned at a base of the fins; a thermal interface material including a first surface and a second surface, the first surface being coupled to the mating surface of the heat sink and the second surface being opposite the first surface so that the second surface can engage a heat transfer surface of the field replaceable computing module installed adjacent the heat sink; and an actuation assembly including a rotational cam, wherein when the rotational cam is in a first position, the second surface of the thermal interface material contacts the heat transfer surface of the field replaceable computing module, and when the rotational cam moved to a second position, the second surface of the thermal interface material is moved a distance away from the heat transfer surface of the field replaceable computing module.

In yet another form, a system is provided, comprising: a field replaceable computing module with a heat transfer surface; a cage defining a chamber sized to receive the field replaceable computing module; a heat sink including fins to facilitate heat dissipation and a mating surface positioned at a base of the fins; a thermal interface material including a first surface and a second surface, the first surface being coupled to the mating surface of the heat sink and the second surface being opposite the first surface so that the second surface can selectively engage the heat transfer surface of the field replaceable computing module when the field replaceable computing module is installed in the chamber of the cage; and an actuation assembly including a rotational cam, wherein when the field replaceable computing module is installed in the chamber of the cage and the rotational cam is in a first position, the second surface of the thermal interface material contacts the heat transfer surface of the field replaceable computing module, and when the rotational cam moved to a second position, the second surface of the thermal interface material is moved a distance away from the heat transfer surface of the field replaceable computing module.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims. In addition, various features from one of the embodiments may be incorporated into another of the embodiments. Accordingly, it is appropriate that the appended claims be construed broadly and in a manner consistent with the scope of the disclosure as set forth in the following claims.

It is also to be understood that the heat sink assembly, apparatus, and system presented herein described herein, or portions thereof, may be fabricated from any suitable material or combination of materials, such as plastic, metal, foamed plastic, wood, cardboard, pressed paper, supple natural or synthetic materials including, but not limited to, cotton, elastomers, polyester, plastic, rubber, derivatives thereof, and combinations thereof. Suitable plastics may include high-density polyethylene (HDPE), low-density polyethylene (LDPE), polystyrene, acrylonitrile butadiene styrene (ABS), polycarbonate, polyethylene terephthalate (PET), polypropylene, ethylene-vinyl acetate (EVA), or the like.

Finally, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

What is claimed is:

1. An apparatus comprising:
   a cage defining a chamber;
   a heat sink including fins to facilitate heat dissipation and a mating surface positioned at a base of the fins;
   a thermal interface material including a first surface and a second surface, the first surface being coupled to the mating surface of the heat sink and the second surface being opposite the first surface so that the second surface can selectively engage a heat transfer surface of a field replaceable computing module installed in the chamber of the cage; and an actuation assembly including a rotational cam, wherein when the rotational cam is in a first position, the second surface of the thermal interface material contacts the heat transfer surface of the field replaceable computing module, and when the rotational cam moved to a second position, the second surface of the thermal interface material is moved a distance away from the heat transfer surface of the field replaceable computing module.

2. The apparatus of claim 1, wherein the second surface of the thermal interface material is parallel to a top of a perimeter of the chamber when the rotational cam is in the second position.

3. The apparatus of claim 2, wherein the heat sink moves along one degree of freedom when moving the rotational cam moves between the first position and the second position.

4. The apparatus of claim 2, wherein the heat sink spans a front-to-back dimension of the chamber.

5. The apparatus of claim 1, wherein the actuation assembly further comprises:
an axle, the rotational cam being mounted on the axle and being movable between the first position and the second position via rotation of the axle.

6. The apparatus of claim 5, wherein the actuation assembly further comprises:
an actuator connected to the axle and configured to cause the rotation of the axle in response to rotational actuations of the actuator.

7. The apparatus of claim 6, wherein the actuator comprises:
a fixed portion that is only rotatable; and
a rider that rotates with the fixed portion and is movable along the fixed portion to selectively lock the axle in positions that lock the rotational cam in the first position or the second position.

8. The apparatus of claim 5, wherein the cage further comprises:
a rear support bracket that supports at least the axle.

9. The apparatus of claim 1, wherein the heat sink further comprises at least one pair of longitudinal channels, and the apparatus further comprises:
at least one pair of guide pins configured to engage the at least one pair of longitudinal channels.

10. The apparatus of claim 1, wherein the heat sink further comprises:
a locking feature disposed on its mating surface, the locking feature being configured to removably engage a corresponding feature included on the heat transfer surface of the field replaceable computing module installed in the chamber of the cage when the rotational cam is in the first position.

11. A heat sink assembly for a cage for a field replaceable computing module, comprising:
a heat sink including fins to facilitate heat dissipation and a mating surface positioned at a base of the fins;
a thermal interface material including a first surface and a second surface, the first surface being coupled to the mating surface of the heat sink and the second surface being opposite the first surface so that the second surface can engage a heat transfer surface of the field replaceable computing module installed adjacent the heat sink; and an actuation assembly including a rotational cam, wherein when the rotational cam is in a first position, the second surface of the thermal interface material contacts the heat transfer surface of the field replaceable computing module, and when the rotational cam moves to a second position, the second surface of the thermal interface material is moved a distance away from the heat transfer surface of the field replaceable computing module.

12. The heat sink assembly of claim 11, wherein the second surface of the thermal interface material is parallel to the heat transfer surface of the field replaceable computing module when the rotational cam is in the second position.

13. The heat sink assembly of claim 12, wherein the heat sink moves along one degree of freedom when moving the rotational cam moves between the first position and the second position.

14. The heat sink assembly of claim 11, wherein the actuation assembly further comprises:
an axle, the rotational cam being mounted on the axle and being movable between the first position and the second position via rotation of the axle.

15. The heat sink assembly of claim 14, wherein the actuation assembly further comprises:
an actuator connected to the axle and configured to cause the rotation of the axle in response to rotational actuations of the actuator.

16. The heat sink assembly of claim 14, wherein the heat sink further comprises:
a through hole extending through the fins of the heat sink, the axle extending through the through hole.

17. The heat sink assembly of claim 11, wherein the heat sink further comprises at least one pair of longitudinal channels, and the heat sink assembly further comprises:
at least one pair of guide pins configured to engage the at least one pair of longitudinal channels.

18. A system comprising:
a cage defining a chamber sized to receive a field replaceable computing module with a heat transfer surface;
a heat sink including fins to facilitate heat dissipation and a mating surface positioned at a base of the fins;
a thermal interface material including a first surface and a second surface, the first surface being coupled to the mating surface of the heat sink and the second surface being opposite the first surface so that the second surface can selectively move within or into abutment with a perimeter of the chamber to engage the heat transfer surface of the field replaceable computing module when the field replaceable computing module is installed in the chamber of the cage; and an actuation assembly including a rotational cam, wherein when the field replaceable computing module is installed in the chamber of the cage and the rotational cam is in a first position, the second surface of the thermal interface material is disposed within or adjacent the perimeter of the chamber and contacts the heat transfer surface of the field replaceable computing module, and when the rotational cam moved to a second position, the second surface of the thermal interface material is moved a distance away from the perimeter of the chamber so that is separated from the heat transfer surface of the field replaceable computing module.

19. The system of claim 18, further comprising:
circuitry configured to activate a light to provide an illuminated indication when the rotational cam is in at least one of the first position or the second position.

20. The system of claim 18, wherein the heat sink further comprises:
a locking feature disposed on its mating surface, the locking feature being configured to removably engage a corresponding feature included on the heat transfer surface of the field replaceable computing module installed in the chamber of the cage when the rotational cam is in the first position.

* * * * *